US011011602B2

(12) United States Patent
Yang

(10) Patent No.: US 11,011,602 B2
(45) Date of Patent: May 18, 2021

(54) CIRCUITS EMPLOYING ADJACENT LOW-K DUMMY GATE TO A FIELD-EFFECT TRANSISTOR (FET) TO REDUCE FET SOURCE/DRAIN PARASITIC CAPACITANCE, AND RELATED FABRICATION METHODS

(71) Applicant: QUALCOMM Incorporated, San Diego, CA (US)

(72) Inventor: Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 186 days.

(21) Appl. No.: 16/196,388

(22) Filed: Nov. 20, 2018

(65) Prior Publication Data
US 2020/0161419 A1 May 21, 2020

(51) Int. Cl.
*H01L 29/06* (2006.01)
*H01L 27/092* (2006.01)
(Continued)

(52) U.S. Cl.
CPC ........ *H01L 29/0649* (2013.01); *H01L 21/764* (2013.01); *H01L 21/823821* (2013.01);
(Continued)

(58) Field of Classification Search
CPC .............. H01L 29/0649; H01L 21/764; H01L 21/823821; H01L 21/823871; H01L 21/832878; H01L 23/535; H01L 27/0924
See application file for complete search history.

(56) References Cited

U.S. PATENT DOCUMENTS

2007/0284628 A1* 12/2007 Kapoor ............. H01L 29/66901
257/270
2016/0043170 A1* 2/2016 Park .................... H01L 27/0886
257/369
(Continued)

OTHER PUBLICATIONS

Bao, T.I., et al., "Challenges of Low Effective-K Approaches for Future Cu Interconnect," 2009 IEEE International Interconnect Technology Conference, Jun. 2009, IEEE, 4 pages.
(Continued)

*Primary Examiner* — Fernando L Toledo
*Assistant Examiner* — Neil R Prasad
(74) *Attorney, Agent, or Firm* — Withrow & Terranova, PLLC

(57) ABSTRACT

Circuits employing an adjacent low-k dummy gate to a field-effect transistor (FET) to reduce FET source/drain parasitic capacitance, and related fabrication methods. To reduce or mitigate an increase in the source/drain parasitic capacitance(s) of a FET, a dummy gate adjacent to an active gate of the FET is provided to have a low-k (i.e., low relative permittivity). In this manner, the relative permittivity (k) between the source/drain of the FET and an adjacent dummy gate and/or source/drain of another FET is reduced, thereby reducing the parallel plate capacitance of the FET(s). Reducing parasitic capacitance of the FET(s) may allow further reduced scaling of the circuit to offset or mitigate a lack of reduction or increase in parasitic capacitance as a result of reducing gate pitch in the circuit. As gate pitch is reduced in the circuit, it may not be possible to proportionally reduce gate size without sacrificing gate control.

21 Claims, 19 Drawing Sheets

(51) Int. Cl.
    *H01L 23/535*     (2006.01)
    *H01L 21/8238*     (2006.01)
    *H01L 21/764*     (2006.01)

(52) U.S. Cl.
    CPC ............ *H01L 21/823871* (2013.01); *H01L 21/823878* (2013.01); *H01L 23/535* (2013.01); *H01L 27/0924* (2013.01)

(56) References Cited

U.S. PATENT DOCUMENTS

| | | | |
|---|---|---|---|
| 2018/0151716 A1* | 5/2018 | Fung | H01L 29/66545 |
| 2018/0315608 A1* | 11/2018 | Tang | H01L 21/31116 |
| 2019/0131452 A1* | 5/2019 | Jha | H01L 21/823807 |
| 2020/0105754 A1* | 4/2020 | Murthy | H01L 29/785 |

OTHER PUBLICATIONS

Sachid, Angada B., et al., "Bulk FinFET With Low-κ Spacers for Continued Scaling," IEEE Transactions on Electron Devices, vol. 64, No. 4, Apr. 2017, pp. 1861-1864.

* cited by examiner

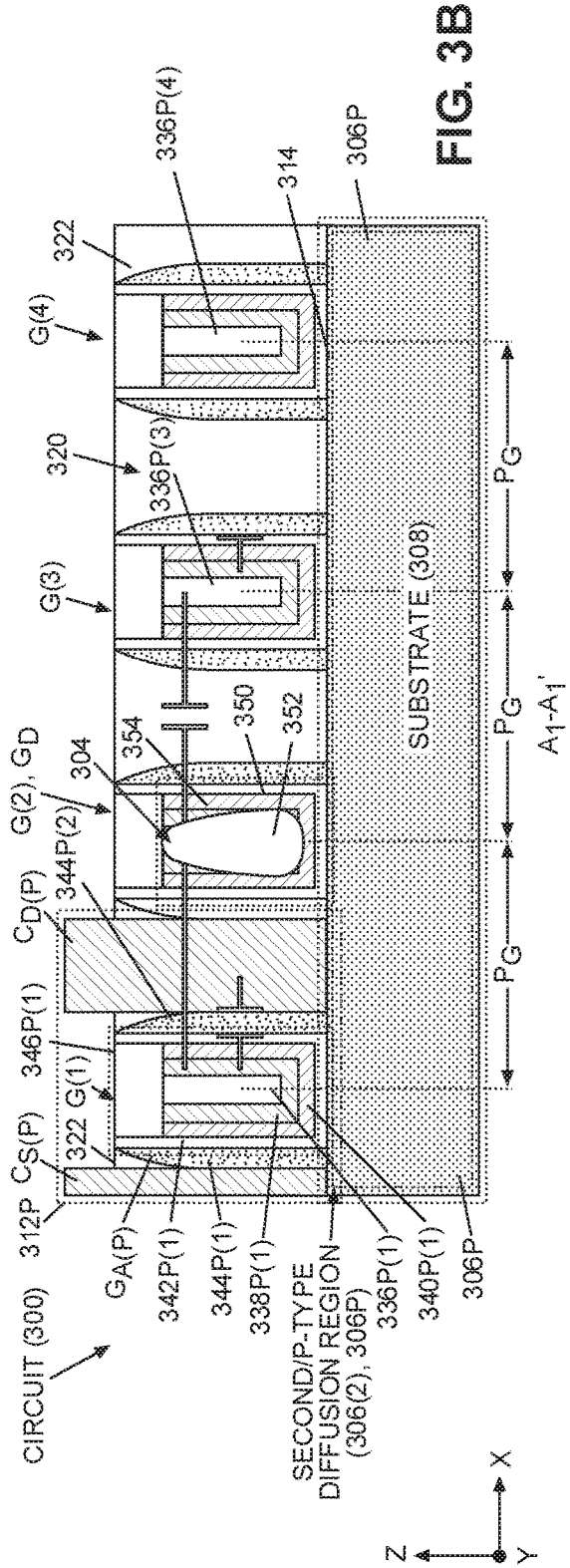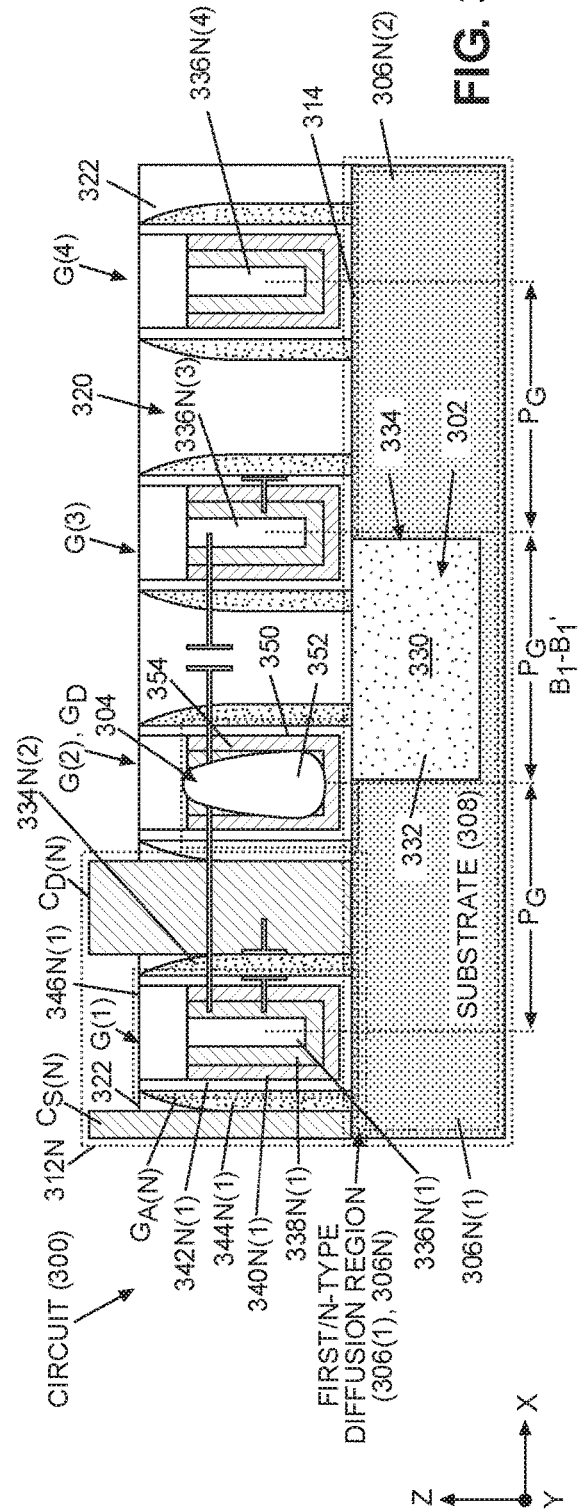

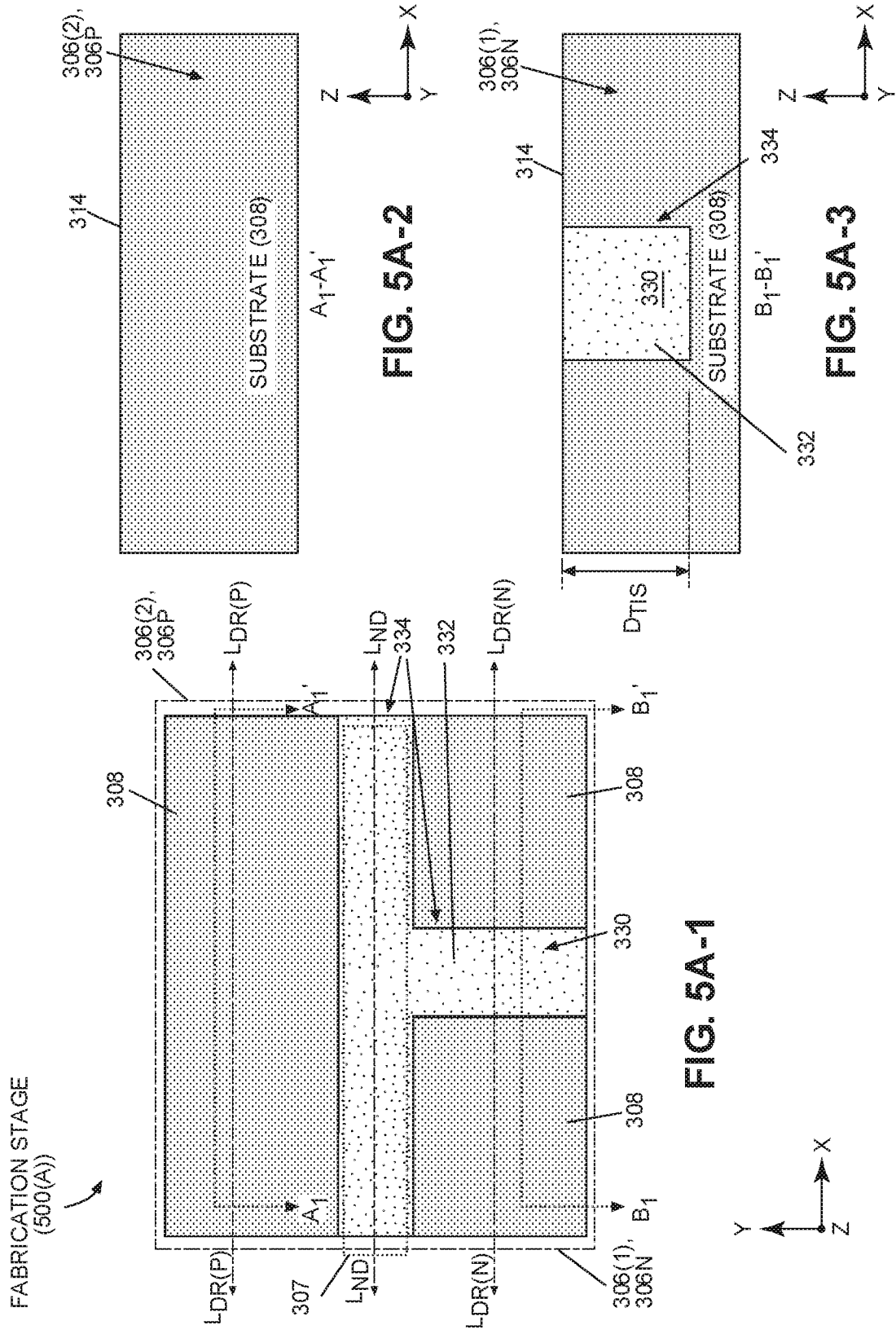

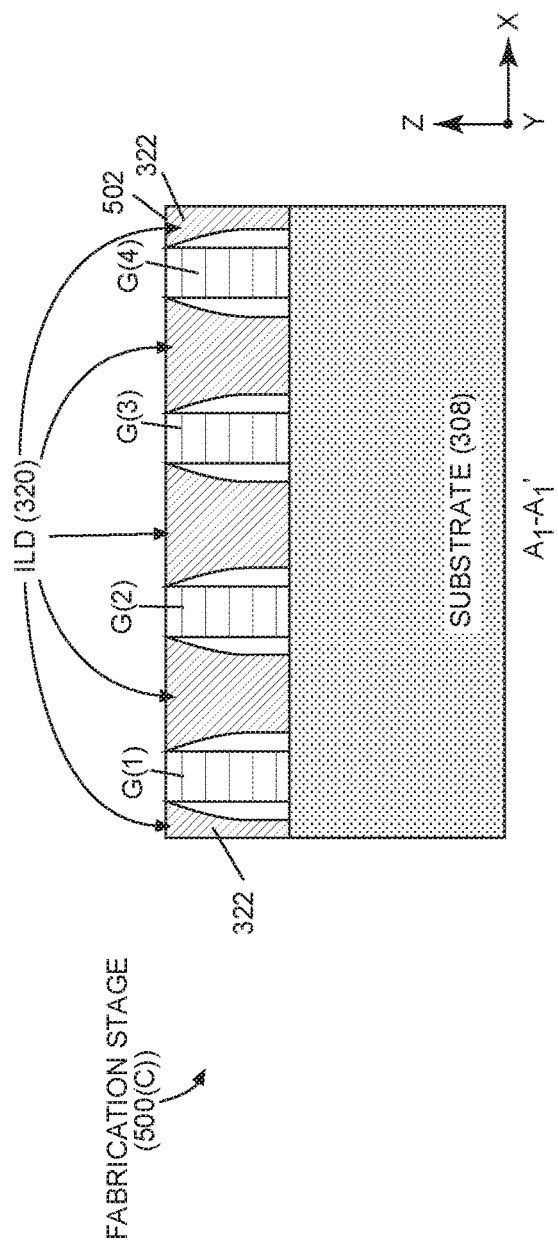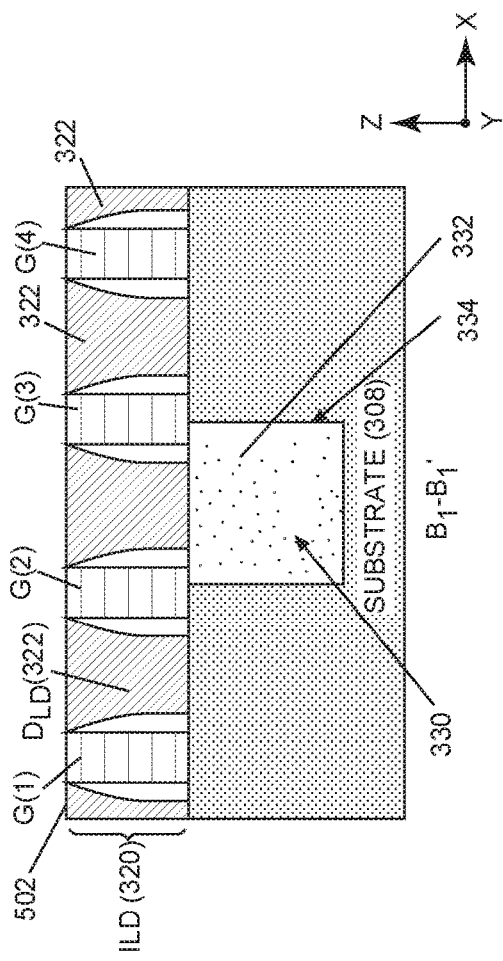

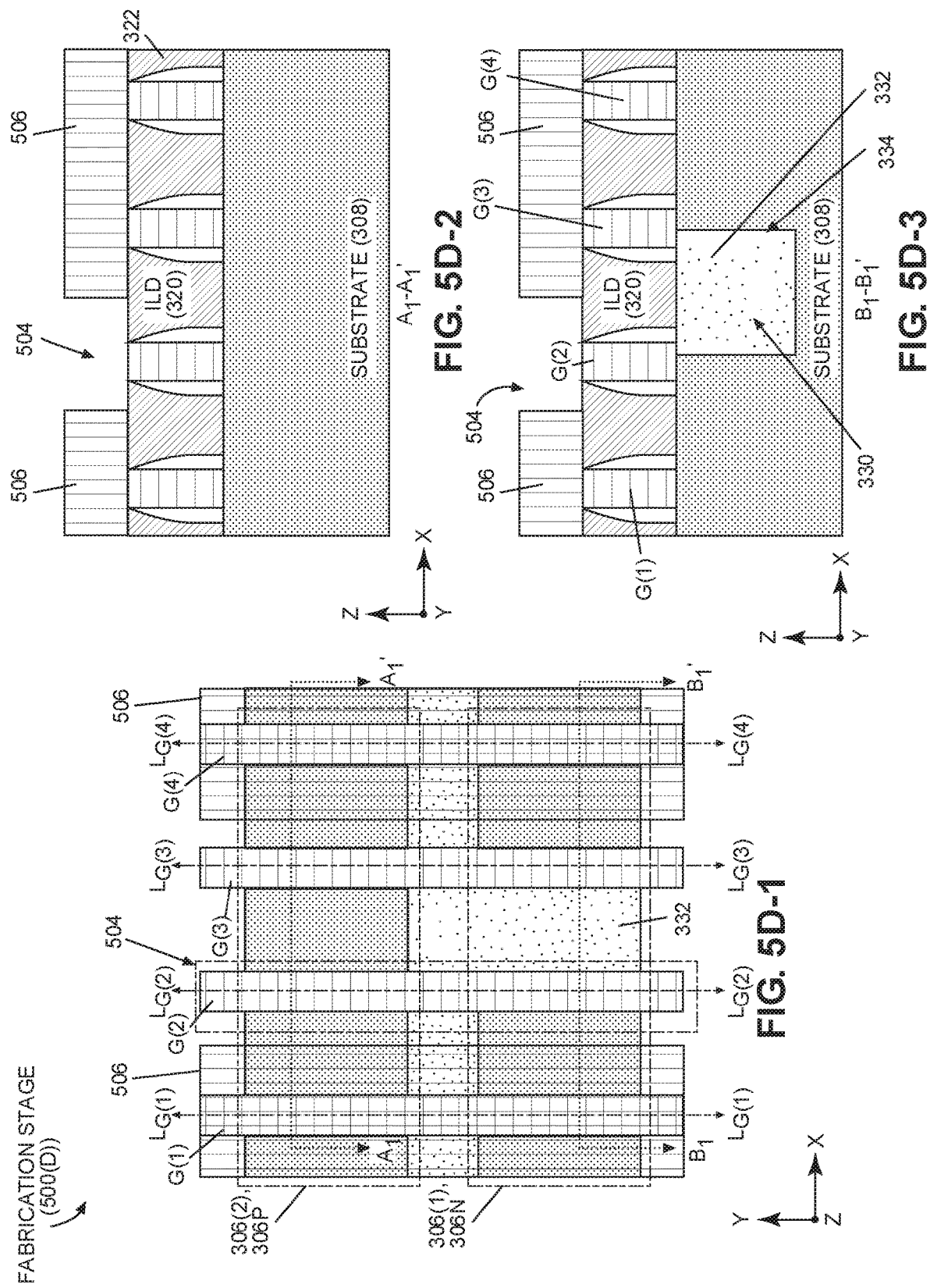

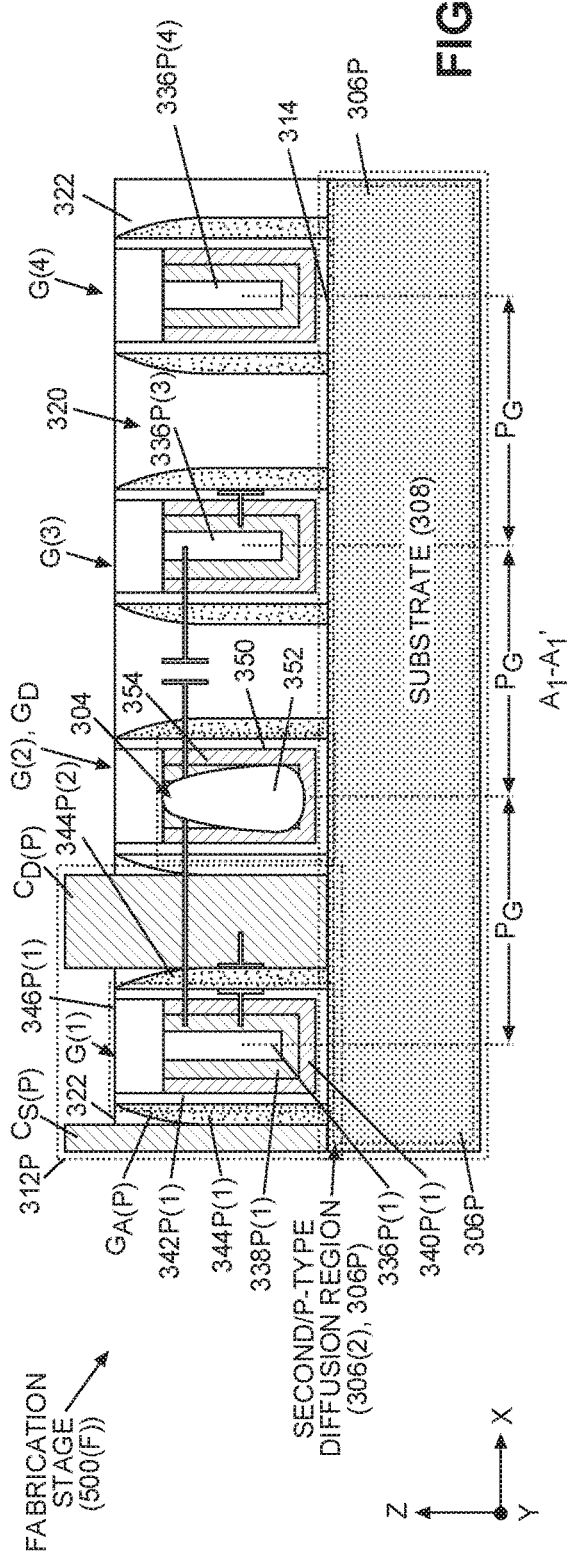
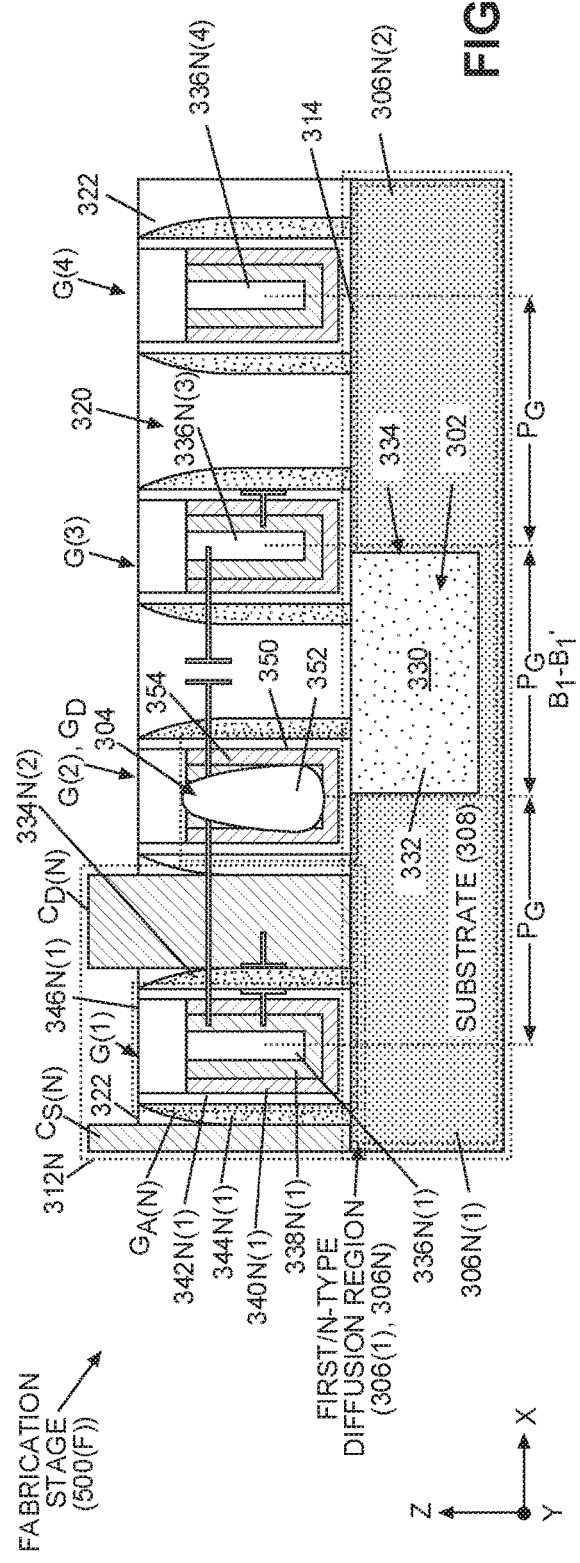

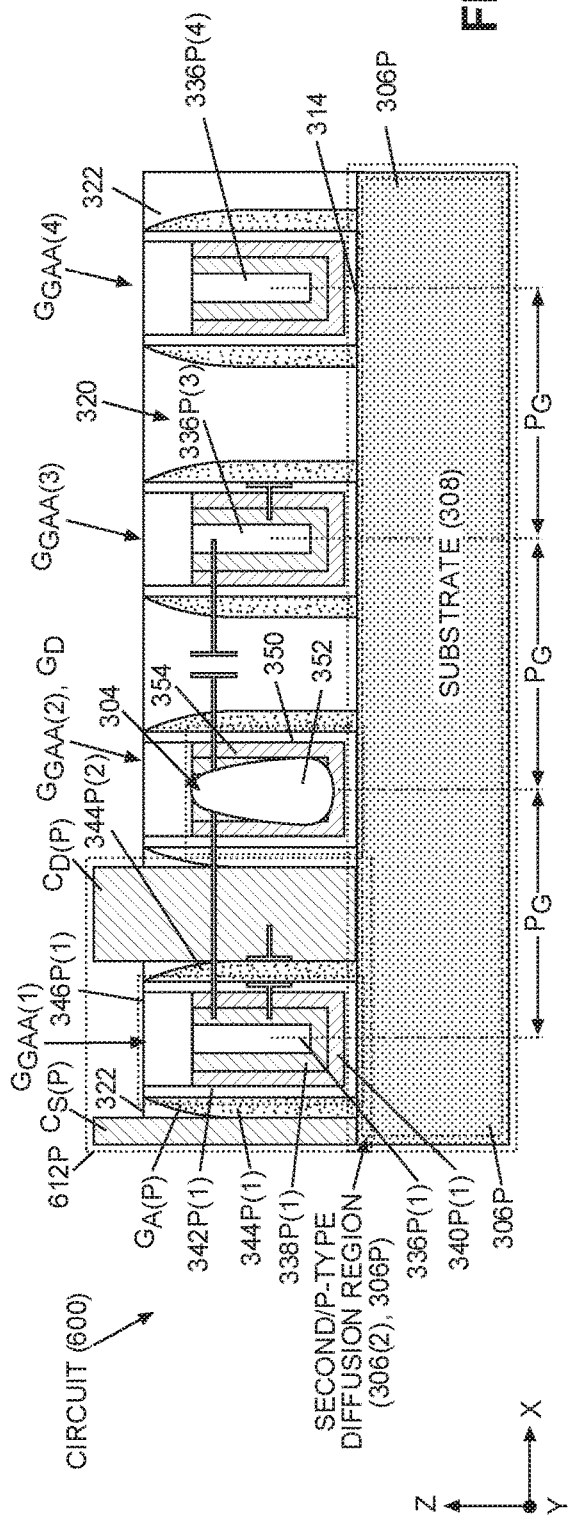
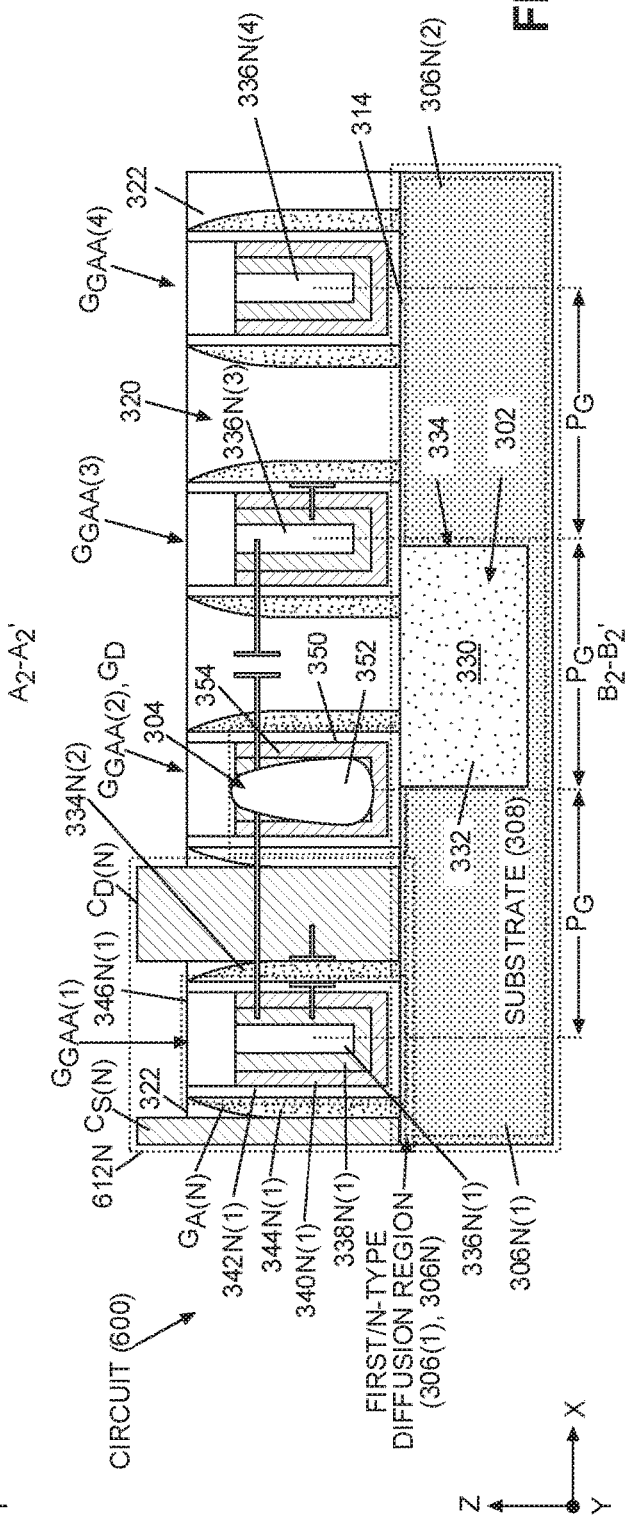
FIG. 6B
FIG. 6C

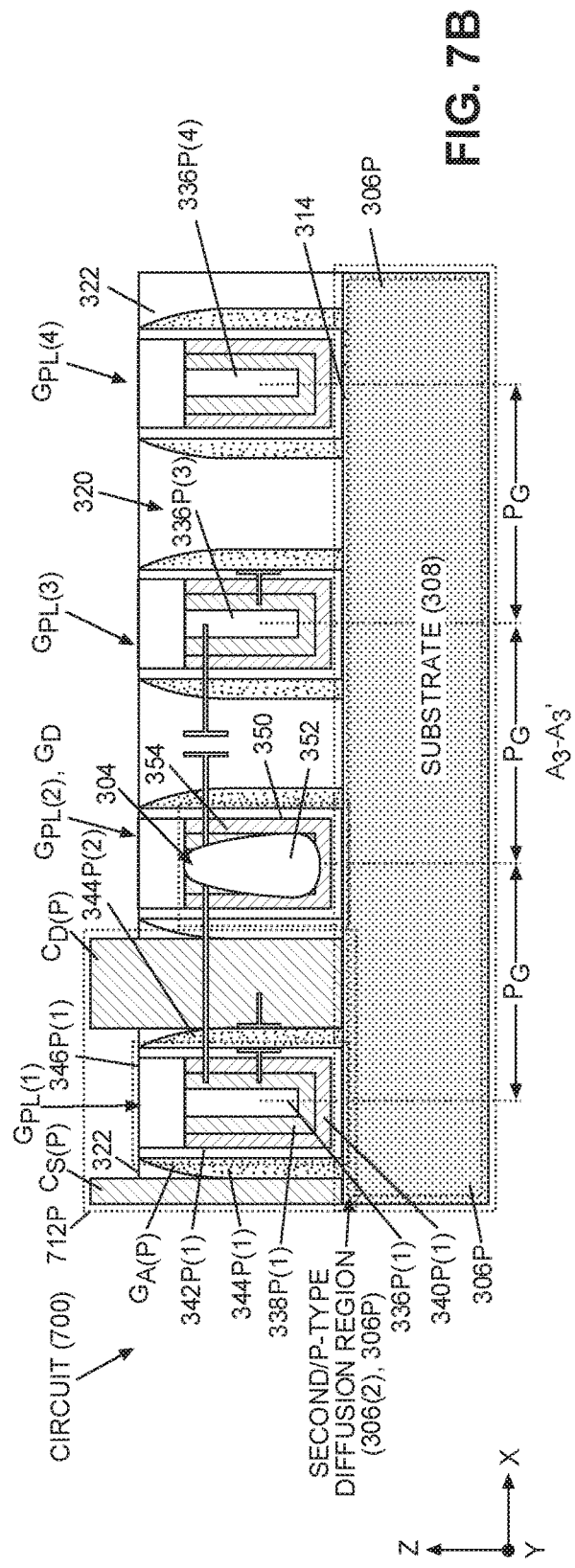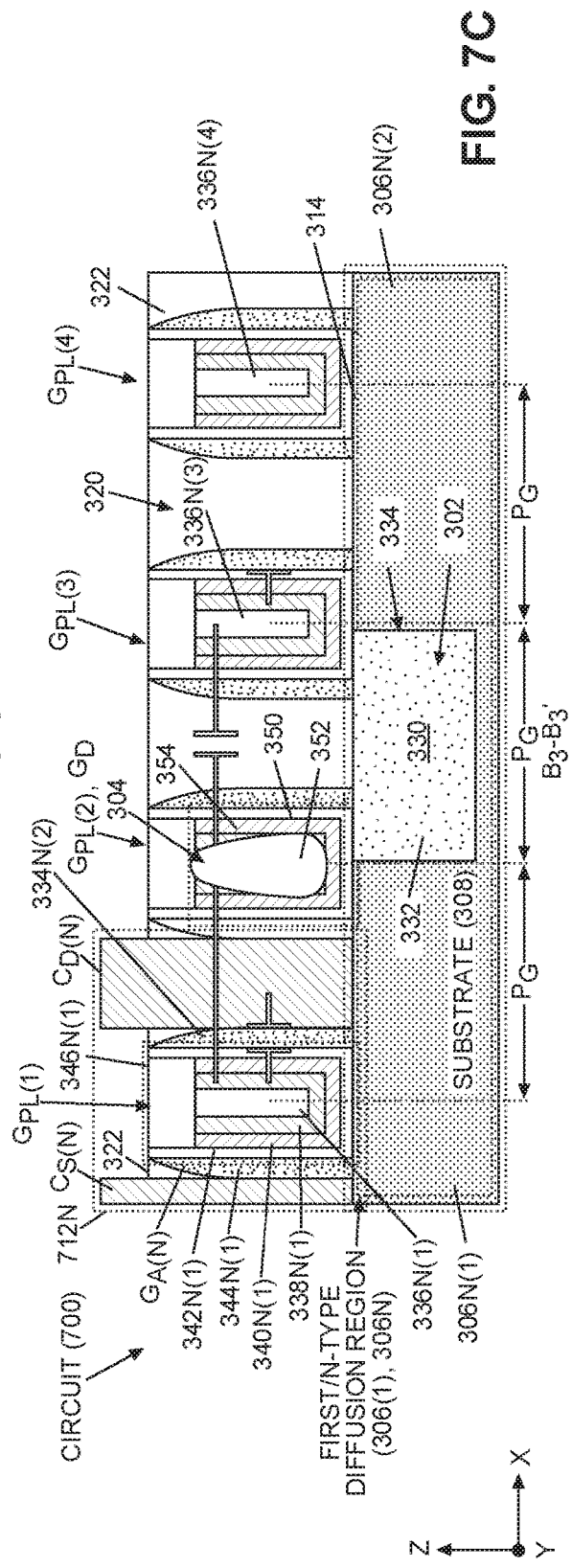

CIRCUITS EMPLOYING ADJACENT LOW-K DUMMY GATE TO A FIELD-EFFECT TRANSISTOR (FET) TO REDUCE FET SOURCE/DRAIN PARASITIC CAPACITANCE, AND RELATED FABRICATION METHODS

BACKGROUND

I. Field of the Disclosure

The field of the disclosure relates to integrated circuits (ICs) comprising transistors, such as fin field-effect transistors (FETs) (FinFETs) and gate-all-around (GAA) FETs, formed in an active semiconductor layer material, and more particularly to parasitic capacitance of the FETs in the IC.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

For example, one type of transistor is a Fin Field Effect transistor (FET) (FinFET) that provides a conducting channel via a "Fin" formed from a substrate. FIG. 1 illustrates an exemplary FinFET 100. The FinFET 100 includes a substrate 102 and a fin 104 formed from the substrate 102. The fin 104 is formed from a semiconductor material. The fin 104 may be formed from the substrate 102 by lithography and etching processes to form raised fins 104 from the material of the substrate 102. An oxide layer 106 is included on either side of the fin 104. The FinFET 100 includes a source 108 and a drain 110 interconnected by the fin 104 such that an interior portion of the fin 104 serves as a semiconductor channel 112 between the source 108 and drain 110. The tin 104 is surrounded by a "wrap-around" gate 114. The wrap-around structure of the gate 114 provides better electrostatic control over the semiconductor channel 112, and thus helps reduce the leakage current and overcomes other short channel effects (SCEs).

FinFETs, such as the FinFET 100 in FIG. 1, are capable of delivering high current through a small silicon footprint. Improved electrostatic control and a taller fin height enable high "ON" current for FinFETs. One substantial factor that contributes to the performance of a FET, including the FinFET 100 in FIG. 1, is the parasitic capacitance formed by the capacitive coupling between the source 108/drain 110 (and their contacts) and the gate of a FET. Performance of a FET is generally governed by the equation $P=CV^2f$, where 'P' is power, 'V' is Voltage, and 'f' is switching frequency. Thus, an increase in capacitance 'C' results in a decrease in switching frequency 'f' for a given power 'P.' The capacitance 'C' results in charging and discharging time when switching states in a FET. Gate-to-drain capacitance can also contribute to the Miller capacitance effect, which increases gate capacitance of a transistor thus reducing its switching speed as a result of an increase in effective gate capacitance due to amplification of the effect of the gate-to-drain capacitance. The negative impact of source and drain contact capacitance is further increased in FETs that include multiple channel structures (e.g., fins in a FinFET) to support higher currents and faster switching speeds, because the higher current flows through the same metal contact cross-sectional area.

For example, FIG. 2 illustrates a circuit 200 that includes a semiconductor substrate 202 with a FET 204 formed therein to illustrate the parasitic capacitances formed between a source/drain and a gate. The FET 204 in FIG. 2 includes semiconductor fin 206 that is formed in the circuit 200 above the semiconductor substrate 202. An active gate 208A is formed in the circuit 200 between a source contact 210S and a drain contact 210D that are in contact with respective source 212S and drain 212D. A dummy gate 208D (e.g., a floating gate) is formed on the semiconductor substrate 202 adjacent to the active gate 208A by a gate pitch $P_G$. The dummy gate 208D is part of a double diffusion break (DDB) that includes shallow trench isolation (STI) 214. The dummy gate 208D may alternatively be formed in the circuit 200 to provide additional area for routing. The active gate 208A includes a metal conductor 216A surrounded by work metal function layers 218A, 220A. A dielectric layer 222A surrounds the work metal function layer 220A. The active gate 208A is formed between spacers 224A(1), 224A(2). A capping material 226A is formed over the active gate 208A. The dummy gate 208D is formed between spacers 224D(1), 224D(2) and includes a metal conductor 216D surrounded by work metal function layers 218D, 220D, which is surrounded by a dielectric layer 222D, with a capping material 226D formed over the dummy gate 208D similar to the active gate 208A. Parasitic capacitances 228(1), 228(2) are formed between the drain 210D and the active and dummy gates 208A, 208D acting as parallel conductive plates to each other, as shown in FIG. 2.

The parasitic capacitances 228(1), 228(2) formed in the FET 204 can be reduced to increase performance by scaling down the gate pitch $P_G$ of the circuit 200, resulting in a scaling down of the FET 204. Scaling down the gate pitch $P_G$ also scales down the width of the source and drain contacts 210S, 210D and the metal conductors 216A, 216D of the active and dummy gates 208A, 208D. For example, the FET 204 may be scaled seven (7) nanometers (nm) or five (5) nm as examples. However, eventually, as the gate pitch $P_G$ of the circuit 200 is scaled down to a certain point, the parasitic capacitances 228(1), 228(2) in the FET 204 may actually start to increase, thereby decreasing performance. This is because the scaling down of the gate pitch $P_G$ of the circuit 200 may reach a limit due to the need to provide a minimum width of metal conductor 216A for the active gate 208A to provide sufficient gate control for the FET 204. Reducing the size of the active gate 208A can also make it more difficult to fully align a gate contact with the active gate 208A, thus also reducing gate control performance of the FET 204. Thus, this can cause the parasitic capacitances 228(1), 228(2) in the circuit 200 to increase as further scaling down occurs, decreasing the distance between the source and drain contacts 210S, 210D and the active and dummy gates 208A, 208D because the metal conductors 216A, 216D of the active and dummy gates 208A, 208D do not proportionally decrease in area. Thus, this can cause parasitic capacitance 228(1), 228(2) formed between the drain 212D and the active and dummy gates 208A, 208D to be approximately fifty percent (50%) of the total FET 204 capacitance.

SUMMARY OF THE DISCLOSURE

Aspects disclosed herein include circuits employing an adjacent low-k dummy gate to a field-effect transistor (FET) to reduce FET source/drain parasitic capacitance. Related fabrication methods are also disclosed. In this regard, an integrated circuit ("circuit") is provided that includes a diffusion region(s) formed in a substrate in which a field-effect transistor (FET(s)) can be formed. A dummy gate(s), which may be a floating gate for example, is also formed in the circuit. The dummy gates(s) may form part of a diffusion break and/or be provided to facilitate local writing in the circuit as examples. A parallel-plate parasitic capacitance can be formed in the circuit between source/drain contacts of the FET and a dummy gate that includes a metal conductor. A parasitic capacitance can also be formed between a source/drain contact of the FET and an adjacent source/drain contact of another FET formed in the circuit on an opposite side of the dummy gate regardless of whether the dummy gate includes a metal conductor. These source/drain related parasitic capacitances ("source/drain parasitic capacitances") contribute to the overall capacitance of the FET(s) in the circuit, which affect its switching speed and performance.

In exemplary aspects disclosed herein, to reduce or mitigate an increase in the source/drain parasitic capacitance(s) of a FET in the circuit, a dummy gate adjacent to an active gate of the FET is provided to have a low-k (i.e., low relative permittivity). For example, the dummy gate may include an air gap (k=1) or a low-k dielectric material (e.g., k≤4). As an example, the low-k dummy gate may be formed by removing a metal conductor in the dummy gate formed after a replacement metal gate (RMG) process, and forming an air gap or low-k dielectric material in place of the metal conductor. In this manner, the relative permittivity (k) between the source/drain of the FET and an adjacent dummy gate and/or source/drain of another FET is reduced, thereby reducing the parallel plate capacitance, and thus the parasitic resistance, of the FET(s). As an example, reducing the parasitic capacitance of the FET(s) may allow further reduced scaling of the circuit to offset or mitigate an otherwise lack of reduction or increase in parasitic capacitance as a result of reducing gate pitch in the circuit. This is because as gate pitch is reduced, it may not be possible to proportionally reduce the sizes of gates in the circuit without otherwise sacrificing gate control performance. The size of the gate affects the area of the metal conductor of the gate and alignment of a gate contact to the gate.

In this regard, in one exemplary aspect, a circuit is provided. The circuit comprises a substrate. The circuit also comprises a diffusion region disposed in the substrate, the diffusion region comprising at least one semiconductor channel each having a first longitudinal axis in a first direction. The circuit also comprises a conducting gate disposed above the first diffusion region and extending along a second longitudinal axis orthogonal to the first longitudinal axis. The circuit also comprises a FET in the diffusion region. The FET comprises a gate comprising an active gate in a portion of the conducting gate disposed above the diffusion region, a semiconductor channel among the at least one semiconductor channel, a source in a first end portion of the semiconductor channel, and a drain in a second end portion of the semiconductor channel. The circuit also comprises a low-k dummy gate comprising a low-k dielectric structure disposed above the diffusion region and extending along a third longitudinal axis orthogonal to the first longitudinal axis, a gate pitch from the active gate of the FET, and disposed adjacent to either the source or the drain of the FET.

In another exemplary aspect, a circuit is provided. The circuit comprises a substrate. The circuit also comprises a means for providing a diffusion in the substrate, the means for providing the diffusion comprising at least one means for providing a semiconducting channel. The circuit also comprises a means for controlling conduction in the at least one means for providing a semiconducting channel. The circuit also comprises a FET in the means for providing the diffusion. The FET comprises a gate comprising an active gate in a portion of the means for controlling conduction, a semiconductor channel among the at least one means for providing a semiconducting channel, a source in a first end portion of the semiconductor channel, and a drain in a second end portion of the semiconductor channel. The circuit also comprises a means for providing a low-k isolation adjacent to the active gate of the FET by a gate pitch and disposed adjacent to either the source or the drain of the FET.

In another exemplary aspect, a method of fabricating a circuit is provided. The method comprises forming a substrate. The method also comprises forming a diffusion region having a first longitudinal axis in a first direction in the substrate. The method also comprises forming a semiconductor channel having a first longitudinal axis in the first direction in the diffusion region. The method also comprises forming a plurality of dummy gates, each extending along longitudinal axes parallel to each other and orthogonal to the first longitudinal axis above the diffusion region, the plurality of dummy gates each spaced apart from each other by a gate pitch. The method also comprises replacing the plurality of dummy gates with a plurality of active gates. The method also comprises forming an opening above a first active gate among the plurality of active gates. The method also comprises removing the first active gate below the opening to form a cavity. The method also comprises forming a low-k dielectric structure in the cavity to form a low-k dummy gate. The method also comprises forming a FET in the diffusion region comprising an active gate in a portion of a second active gate in the diffusion region among the plurality of active gates adjacent to the low-k dummy gate by the gate pitch, and a semiconductor channel comprising forming a source in a first end portion of the semiconductor channel, and forming a drain in a second end portion of the semiconductor channel;, wherein either the source or the drain of the FET is adjacent to the low-k dummy gate.

BRIEF DESCRIPTION OF THE FIGURES

FIGS. 3B and 3C are cross-sectional views taken in respective, different cross-sections of P-type diffusion and N-type diffusion regions in the circuit in FIG. 3A to further illustrate low-k dummy gates adjacent to the FETs;

FIG. 5A-1 is a top view of an exemplary fabrication stage of forming a substrate and forming a patterned shallow trench isolation (STI) to provide a diffusion break in the N-type diffusion region and to create a non-diffusion region between the N-type diffusion region and the P-type diffusion region, in the fabrication of the circuit in FIGS. 3A-3C;

FIGS. 5A-2 and 5A-3 are cross-sectional views taken in respective, different cross-sections of the substrate in the fabrication stage of FIG. 5A-1;

FIG. 5B-1 is a top view of another exemplary fabrication stage of forming dummy gates and spacers adjacent to the dummy gates that extend in the N-type diffusion region and the P-type diffusion regions, forming the source and drain regions, and replacing the dummy gates with metal gates, in the fabrication of the circuit in FIGS. 3A-3C;

FIGS. 5B-2 and 5B-3 are cross-sectional views taken in respective, different cross-sections of the P-type and N-type diffusion regions in the fabrication stage in FIG. 5B-1;

FIGS. 5C-1 and 5C-2 are cross-sectional views taken in respective, different cross-sections of the P-type diffusion and N-type diffusion regions in the fabrication stage of FIG. 5B-1, to illustrate the deposition of an interlayer dielectric (ILD) over the metal gates and the P-type and N-type diffusion regions formed in the fabrication stage in FIG. 5B-1 for isolation, and planarizing a top surface of the ILD in the fabrication of the circuit in FIGS. 3A-3C;

FIG. 5D-1 is a top view of an exemplary fabrication stage of forming a mask over a photoresist layer disposed on the ILD in the fabrication stage in FIG. 5C-1, to form an opening above a metal gate in the P-type and N-type diffusion regions, in the fabrication of the circuit in FIGS. 3A-3C;

FIGS. 5D-2 and 5D-3 are cross-sectional views taken in respective, different cross-sections of the P-type and N-type diffusion regions in the fabrication stage in FIG. 5D-1;

FIG. 5E-1 is a top view of an exemplary fabrication stage of exposing the diffusion break region in the fabrication stage in FIG. 5D-1, to form openings in an active gate area where the exposed metal gate was formed, in the fabrication of the circuit in FIGS. 3A-3C;

FIGS. 5E-2 and 5E-3 are cross-sectional views taken in respective, different cross-sections of the P-type and N-type diffusion regions in the fabrication stage in FIG. 5E-1;

FIG. 5F-1 is a top view of an exemplary fabrication stage of filling the opening in the active gate area in the exposed diffusion break region in the fabrication stage in FIG. 3A to form a low-k dummy gate adjacent to the FETs to reduce the source/drain parasitic capacitance of the FETs, in the fabrication of the circuit in FIGS. 3A-3C;

FIGS. 5F-2 and 5F-3 are cross-sectional views taken in respective, different cross-sections of the P-type and N-type diffusion regions in the fabrication stage in FIG. 5F-1;

FIGS. 6B and 6C are cross-sectional views taken in respective, different cross-sections of P-type diffusion and N-type diffusion regions in the circuit in FIG. 6A to further illustrate low-k dummy gates adjacent to the GAA FETs;

FIGS. 7B and 7C are cross-sectional views taken in respective, different cross-sections of P-type diffusion and N-type diffusion regions in the circuit in FIG. 7A to further illustrate low-k dummy gates adjacent to the planar FETs;

DETAILED DESCRIPTION

Figure 1:
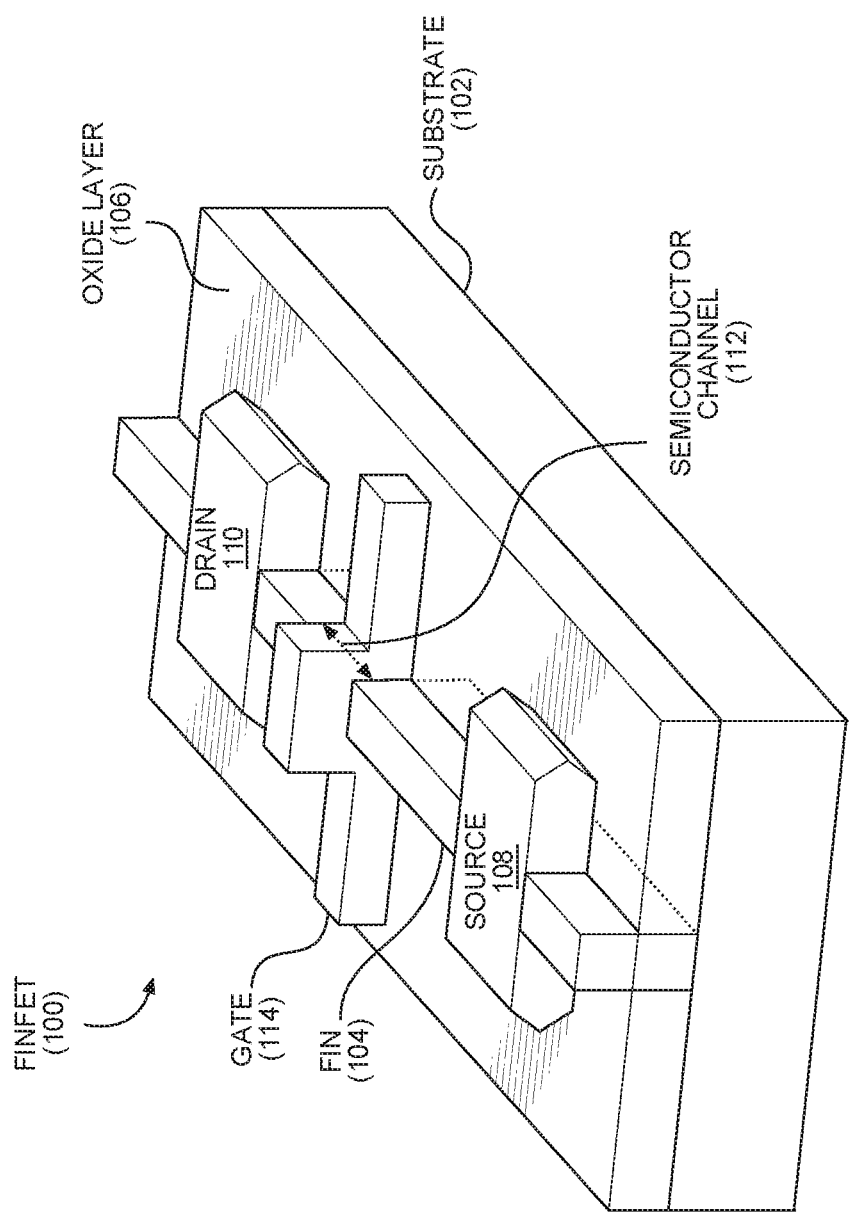
FIG. 1 is a perspective view of an exemplary Fin Field-Effect Transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include circuits employing an adjacent low-k dummy gate to a field-effect transistor (FET) to reduce FET source/drain parasitic capacitance. Related fabrication methods are also disclosed. In this regard, an integrated circuit ("circuit") is provided that includes a diffusion region(s) formed in a substrate in which a field-effect transistor (FET(s)) can be formed. A dummy gate(s), which may be a floating gate for example, is also formed in the circuit. The dummy gates(s) may form part of a diffusion break and/or be provided to facilitate local writing in the circuit as examples. A parallel-plate parasitic capacitance can be formed in the circuit between source/drain contacts of the FET and a dummy gate that includes a metal conductor. A parasitic capacitance can also be formed between a source/drain contact of the FET and an adjacent source/drain contact of another FET formed in the circuit on an opposite side of the dummy gate regardless of whether the dummy gate includes a metal conductor. These source/drain related parasitic capacitances ("source/drain parasitic capacitances") contribute to the overall capacitance of the FET(s) in the circuit, which affect its switching speed and performance.

In exemplary aspects disclosed herein, to reduce or mitigate an increase in the source/drain parasitic capacitance(s) of a FET in the circuit, a dummy gate adjacent to an active gate of the FET is provided to have a low-k (i.e., low relative permittivity). For example, the dummy gate may include an air gap (k=1) or a low-k dielectric material (e.g., k≤4). As an example, the low-k dummy gate may be formed by removing a metal conductor in the dummy gate formed after a replacement metal gate (RMG) process, and forming an air gap or low-k dielectric material in place of the metal conductor. In this manner, the relative permittivity (k) between the source/drain of the FET and an adjacent dummy gate and/or source/drain of another FET is reduced, thereby reducing the parallel plate capacitance, and thus the parasitic resistance, of the FET(s). As an example, reducing the parasitic capacitance of the FET(s) may allow further reduced scaling of the circuit to offset or mitigate an otherwise lack of reduction or increase in parasitic capacitance as a result of reducing gate pitch in the circuit. This is because as gate pitch is reduced, it may not be possible to proportionally reduce the sizes of gates in the circuit without otherwise sacrificing gate control performance. The size of the gate affects the area of the metal conductor of the gate and alignment of a gate contact to the gate.

Figure 3A:
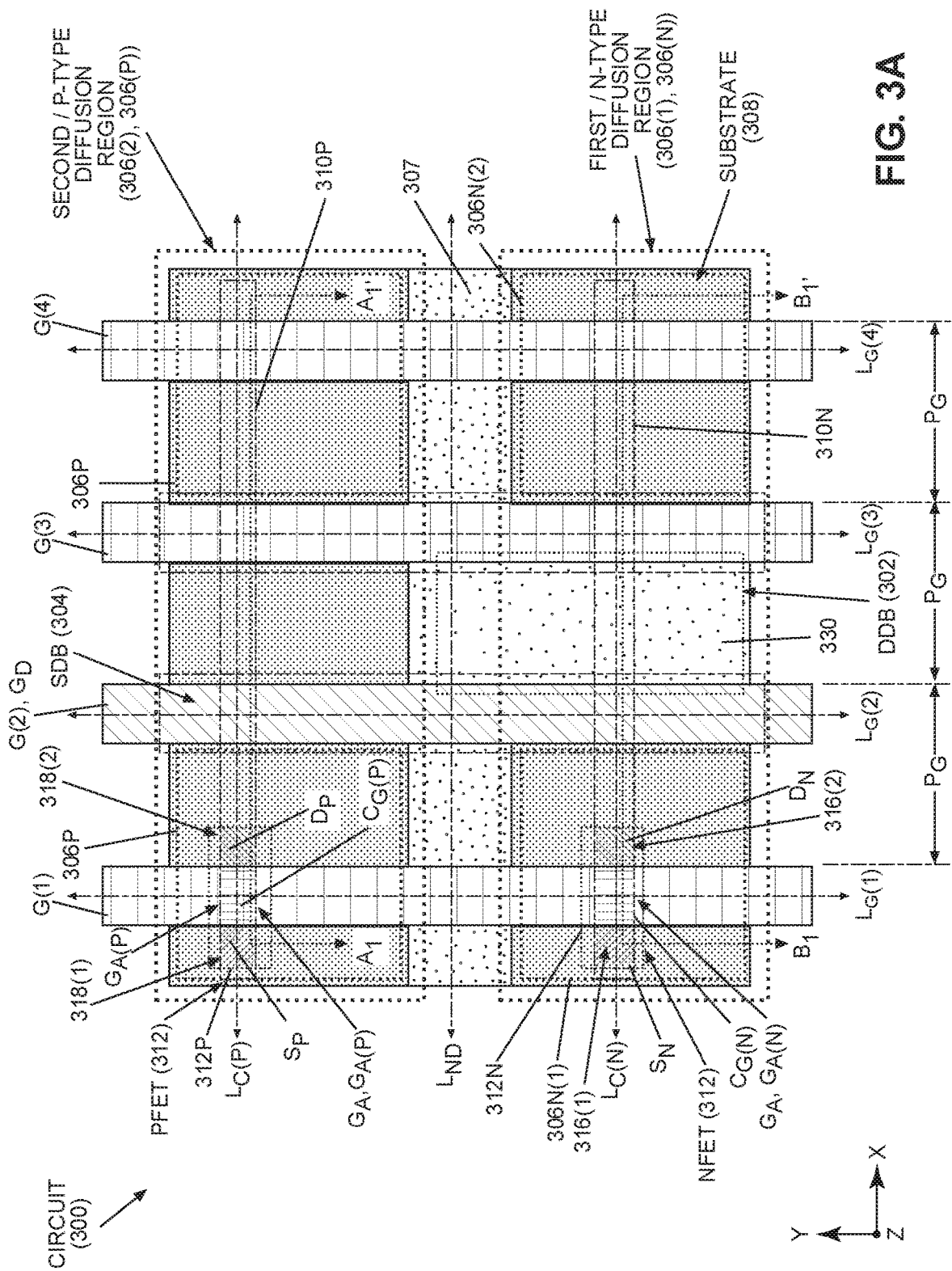
FIG. 3A is a top view of an exemplary integrated circuit ("circuit") that includes FETs in the form of FinFETs formed in P-type and N-type diffusion regions, wherein the circuit further includes a low-k dummy gate adjacent to the FETs to reduce the source/drain parasitic capacitance of the FETs.

In this regard, FIGS. 3A-3C illustrate an exemplary circuit 300 that includes a low-k dummy gate G(2), $G_D$ adjacent to a FET 312 to reduce the source/drain parasitic capacitance of the FET 312. FIG. 3A is a top view of the circuit 300. FIGS. 3B and 3C are cross-sectional views taken in respective, cross-sections $A_1$-$A_1'$, $B_1$-$B_1'$ of the circuit 300 in FIG. 3A to further illustrate low-k dummy gate G(2), $G_D$ adjacent to a FET 312 to reduce the source/drain parasitic capacitance of the FET 312. The circuit 300 may be an integrated circuit (IC) that can be fabricated in an IC chip. As will be discussed in more detail, to reduce or mitigate an increase in the source/drain parasitic capacitance(s) of a FET 312 in the circuit 300, the low-k dummy gate G(2), $G_D$ adjacent to an active gate $G_A$ of the FET 312 is provided to have a low-k (i.e., low relative permittivity). As examples, the low-k dummy gate G(2), $G_D$ may include an air gap (k=1) or a low-K dielectric material (e.g., k≤4). In this manner, the relative permittivity (k) between the source/drain of the FET 312 and the adjacent low-k dummy gate G(2), $G_D$ and/or source/drain of another FET is reduced, thereby reducing the parallel plate capacitance, and thus the parasitic resistance, of the FET 312.

As shown in FIG. 3A, the circuit 300 in this example is a complementary metal oxide semiconductor (CMOS) circuit that includes first diffusion region 306(1) as an N-type diffusion region 306(1) (also labeled "306N"), and the second diffusion region as a P-type diffusion region 306(2) (also labeled "306P"). For example, the N-type diffusion region 306N may be formed by doping a portion of a semiconductor substrate 308 (e.g., Silicon (Si)) with a pentavalent impurity material as a donor material that is able to give up free electrons in the substrate 308. Likewise as an example, the P-type diffusion region 306P may be formed by doping a portion of the semiconductor substrate 308 with an impurity material that is able to leave holes in the substrate 308. In this example, a double diffusion break (DDB) 302 is formed in the N-type diffusion region 306N, and a single diffusion break (SDB) 304 is formed in the P-type diffusion region 306P. The DDB 302 and SDB 304 are isolation structures that are formed in their respective N-type and P-type diffusion regions 306N, 306P to provide isolation to impede the flow of electrons or holes between different semiconductor channels of FETs or other semiconductor devices formed on different sides of the respective DDB 302 and SDB 304 in the X-axis direction. For example, the DDB 302 or SDB 304 may be included in the circuit 300 if a circuit design calls for a different bias voltage to he applied to different semiconductor devices formed in the circuit requiring isolation. Also note that the N-type diffusion region 306N is formed in the circuit 300 according to a circuit cell as one diffusion region, but is separated into two N-type diffusion sub-regions 306N(1), 306N(2) by the DDB 302. Likewise, note that the P-type diffusion region 306P is formed in the circuit 300 according to a circuit cell as one P-type diffusion sub-region 306P by the SDB 304. Also note that there is a non-diffusion region 307 having a longitudinal axis $L_{ND}$ in the X-axis direction between the P-type diffusion region 306P and the N-type diffusion region 306N in the circuit 300.

As shown in FIG. 3A, in this example, N-type and P-type semiconductor channels 310N, 310P in the form of "Fins" are formed in the circuit 300 above the substrate 308 and extended along longitudinal axes $L_{C(N)}$, $L_{C(P)}$ in the X-axis direction. Gates G(1)-G(4) are formed in the circuit 300 along longitudinal axes $L_{G(1)}$-$L_{G(4)}$ in the Y-axis direction, orthogonal to the longitudinal axes $L_{C(N)}$, $L_{C(P)}$ of the N-type and P-type semiconductor channels 310N, 310P in the X-axis direction, and extend above and around at least a portion of the N-type and P-type semiconductor channels 310N, 310P. Gates G(1) and G(4) are active gates of a conductive material, such as metal, (referred to herein as "active gates" G(1) or G(4)). Gates G(1), G(3), and G(4) are conducting gates that can be employed to provide an active gate for forming a FET 312 or as an interconnection for local wiring connections in the circuit 300. in this example, gate G(2) is a dummy gate $G_D$ (referred to herein as "dummy gate" G(2) or $G_D$). As shown in FIG. 3A, a three dimensional (3D) N-type FET (NFET) 312N in the form of a FinFET in this example is formed in the N-type diffusion region 306N by forming a source $S_N$ and drain $D_N$ on opposites sides of the active gate $G_{A(N)}$ in the conducting gate G(1) in the N-type diffusion region 306N. Similarly, as shown in FIG. 3A, a 3D P-type FET (PFET) 312P also in the form of a FinFET in this example is formed in the P-type diffusion region 306P by forming a source $S_P$ and drain $D_P$ on opposites sides of the active gate $G_{A(P)}$ in the conducting gate G(1) in the P-type diffusion region 306P.

With reference to FIGS. 3B and 3C, the N-type and P-type semiconductor channels 310N, 310P are disposed on a top surface 314 of the substrate 308 in this example. The gates G(1)-G(4) are located adjacent to each other and have a gate pitch $P_G$ according to the layout of a circuit cell. For example, gate G(1) is located adjacent to dummy gate G(2), $G_D$. Dummy gate G(2), $G_D$ is disposed between and adjacent to gate G(1) and gate G(3). Any of conducting gates G(1), G(3), G(4) can be employed to form active gates for FETs formed in the circuit 300, but in this example as shown in FIGS. 3A-3C, conducting gate G(1) is employed as an active gate that extends around at least a portion of the N-type and P-type semiconductor channels 310N, 310P and provides active gates $G_{A(P)}$, $G_{A(N)}$, for a respective 3D PFET 312P and NFET 312N, which may be FinFETs or Gate-All-Around (GAA) FETs. Note however, the active gates $G_{A(P)}$, $G_{A(N)}$ of the conducting gate G(1) may only extend above the N-type and P-type semiconductor channels 310N, 310P, providing for active gates $G_{A(P)}$, $G_{A(N)}$ to form planar FETs. As shown in FIG. 3A, a gate contact $C_{G(N)}$ is formed over a portion of the conducting gate G(1) to form the active gate $G_{A(N)}$ for the NFET 312N. Similarly, a gate contact $C_{G(P)}$ is formed over a portion of the conducting gate G(1) to form the active gate $G_{A(P)}$ for the PFET 312P. The source $S_N$ and a drain $D_N$ of the NFET 312N are formed in first and second end portions 316(1), 316(2) in the N-type semiconductor channel 310N on opposite sides of the active gate G(1) where the gate contact $C_{G(N)}$ is formed over the active gate $G_{A(N)}$. The source $S_P$ and drain $D_P$ of the PFET 312P are formed in first and second end portions 318(1), 318(2) in the P-type semiconductor channel 310P on opposite sides of the conducting gate G(1) where the gate contact $C_{G(P)}$ is formed over the active gate $G_{A(P)}$. As shown in FIGS. 3B and 3C, respective metal source contacts $C_{S(P)}$, $C_{S(N)}$ and metal drain contacts $C_{D(P)}$, $C_{D(N)}$ are formed above and in contact with the respective sources $S_P$, $S_N$ and drains $D_P$, $D_N$.

With reference to FIG. 3B, the active gate $G_{A(P)}$ of the PFET 312P formed in the P-type diffusion region 306P includes a metal conductor 336P(1) surrounded by work metal function layers 338P(1), 340P(1). A dielectric material layer 342P(1) surrounds the work metal function layer

340P(1).) The active gate $G_{A(P)}$ is formed between spacers 344P(1), 344P(2). A capping material 346P(1) is formed over the active gate $G_{A(P)}$. Similarly, with reference to FIG. 3C, the active gate $G_{A(N)}$ of the NFET 312N formed in the N-type diffusion region 306N includes a metal conductor 336N(1) surrounded by work metal function layers 338N(1), 340N(1). A dielectric material layer 342N(1) surrounds the work metal function layer 340N(1). The active gate $G_{A(N)}$ is formed between spacers 344N(1), 344N(2). A capping material 346N(1) is formed over the active gate $G_{A(P)}$.

With reference to FIG. 3B, a parallel-plate capacitance can form between the metal conductor 336P(1) of the active gate $G_{A(P)}$ of the PFET 312P and the adjacent metal drain contact $C_{D(P)}$ as a gate-to-drain capacitance, thus contributing to a parasitic capacitance of the drain $D_{(P)}$ of the PFET 312P. A parallel-plate capacitance can also form between the metal conductor 336P(1) of the active gate $G_{A(P)}$ of the PFET 312P and an adjacent metal conductor 336P(3) of the conducting gate G(3) on the opposite side of the dummy gate $G_D$ from the active gate $G_{A(P)}$ also contributing to a parasitic capacitance of the drain $D_{(P)}$ of the PFET 312P. Similarly, with reference to FIG. 3C, a parallel-plate capacitance can form between the metal conductor 336N(1) of the active gate $G_{A(D)}$ of the NFET 312N and the adjacent metal drain contact $C_{D(N)}$ as a gate-to-drain capacitance, thus contributing to a parasitic capacitance of the drain $D_{(N)}$ of the NFET 312N. A parallel-plate capacitance can also form between the metal conductor 336N of the active gate $G_{A(N)}$ of the NFET 312N and the adjacent metal conductor 336N(3) of conducting gate G(3) on the opposite side of the dummy gate $G_D$ from the active gate $G_{A(N)}$ also contributing to a parasitic capacitance of the drain $D_{(N)}$ of the NFET 312N. An increase in parasitic capacitance in the PFET 312P and NFET 312N results in a decrease in switching frequency for a given power. This parasitic capacitance in the PFET 312P and NFET 312N results in charging and discharging time when switching states in the PFET 312P and NFET 312N. Gate-to-drain capacitance can also contribute to the Miller capacitance effect, which increases gate capacitance of the PFET 312P and NFET 312N, thus reducing their switching speed as a result of an increase in effective gate capacitance due to amplification of the effect of the gate-to-drain capacitance. The negative impact of source and drain contact capacitance is further increased in PFET 312P and NFET 312N if such were to include multiple channel structures (e.g., fins in a FinFET) to support higher currents and faster switching speeds, because the higher current flows through the same metal contact cross-sectional area.

Also, if the gate pitch $P_G$ of the circuit 300 in FIGS. 3A-3C is scaled down to a certain point, the parasitic capacitances in the PFET 312P and NFET 312N may actually start to increase, thereby decreasing performance. This is because the scaling down of the gate pitch $P_G$ of the circuit 300 may reach a limit due to the need to provide a minimum width of metal conductors 336P(1), 336N(1) for the active gates $G_{A(P)}$, $G_{A(N)}$ to provide sufficient gate control for the PFET 312P and NFET 312N. Reducing the size of the active gates $G_{A(P)}$, $G_{A(N)}$ can also make it more difficult to fully align a gate contact with the active gates $G_{A(P)}$, $G_{A(N)}$, thus also reducing gate control performance of the PFET 312P and NFET 312N. Thus, this can cause the parasitic capacitances in the circuit 300 to increase as further scaling down occurs, decreasing the distance between the metal source contacts $C_{S(P)}$, $G_{A(N)}$, the metal drain contacts $C_{D(P)}$, $C_{D(N)}$, and the respective active gates $G_{A(P)}$, $G_{A(N)}$, because the metal conductors 336P(1), 336N(1) of the active gates $G_{A(P)}$, $G_{A(N)}$ do not proportionally decrease in area. Thus, this can cause parasitic capacitance(s) formed between the drains $D_{(P)}$, $D_{(N)}$ and the respective active gates $G_{A(P)}$, $G_{A(N)}$ to be approximately fitly percent (50%) of the total respective PFET 312P and NFET 312N capacitance.

Thus, to reduce or mitigate an increase in the source/drain parasitic capacitance(s) of the PFET 312P and/or the NFET 312N in the circuit 300 in FIGS. 3A-3C, the dummy gate $G_D$ adjacent to active gates $G_{A(P)}$, $G_{A(N)}$ and respective metal drain contacts $C_{D(P)}$, $C_{D(N)}$ of the PFET 312P and/or the NFET 312N in this example, is provided to have a low-k dielectric structure 350 (i.e., the low-k dielectric structure 350 has a low relative permittivity). This is discussed in more detail below. in this manner, the relative permittivity (k) between the metal drain contacts $C_{D(P)}$, $C_{D(N)}$ of the PFET 312P and/or the NFET 312N and the adjacent dummy gate $G_D$ is reduced, thereby reducing the parallel plate capacitance of the metal drain contacts $C_{D(P)}$, $C_{D(N)}$ of the PFET 312P and/or the NFET 312N, and thus reducing the parasitic resistance of the PFET 312P and/or the NFET 312N. Also, the dummy gate $G_D$ having the low-k dielectric structure 350 disposed between the metal drain contacts $C_{D(P)}$, $C_{D(N)}$ of the PFET 312P and/or the NFET 312N and adjacent conducting gate G(3) reduces the parallel plate capacitance of the metal drain contacts $C_{D(P)}$, $C_{D(N)}$ to the adjacent conducting gate G(3), thus reducing the parasitic resistance of the PFET 312P and/or the NFET 312N. For example, the low-k dielectric structure 350 may have a permittivity less than or equal to 4.0, and between 3.0 to 3.5 as non-limiting examples. As shown in FIGS. 3B and 3C, the low-k dielectric structure 350 of the dummy gate $G_D$ in this example includes an air gap 352. The air gap may have a permittivity of 1.0. A dielectric material 354 may surround the air gap 352. As will be discussed in more detail below, the dielectric material 354 may be disposed in a cavity formed during fabrication of the circuit 300 as part of a metal replacement gate (RMG) process, where the dummy gate $G_D$ is shown in FIGS. 3B and 3C, such that a void is present in the cavity to form the air gap 352. For example, the cavity could be a lower pressure chamber that filled with a chemical gas during dielectric material formation. As another example, the air gap 352 may be at least fifteen percent (15%) of a volume of the low-k dielectric structure 350.

As another example, the low-k dielectric structure 350 of the dummy gate $G_D$ may not include an air gap, or an air gap that is at least fifteen percent (15%) of a volume of the low-k dielectric structure 350. Instead, the low-k dielectric structure 350 may be formed from the dielectric material 354 that does not include an air gap, For example, the low-k dielectric structure 350 may be deemed to not include an air gap when low-k dielectric structure 350 does not include a void (i.e., absence) of material or other structure) in the low-k dielectric structure 350 greater than fourteen percent (14%) of the volume of the low-k dielectric structure 350. For example, the dielectric material 354 may have a permittivity less than or equal to 4.0, and between 3.0 to 3.5 as non-limiting examples whether the low-k dielectric structure 350 includes the air gap 352 or not. The dielectric material 354 may be a material selected from an oxide material, a silicon oxide material, or a carbon-doped silicon oxide material as non-limiting examples.

As also shown in FIGS. 3B and 3C, an interlayer dielectric (HD) 320 of a dielectric material 322 is disposed above the N-type and P-type semiconductor channel 310N, 310P and the gates G(1)-G(4) provide electrical isolation between these structures and adjacently form conductive structures and/or interconnect layers formed in metal layers in the circuit 300. As shown in FIG. 3B, the SDB 304 is formed by the dummy gate G(2), $G_D$ in the P-type diffusion region 306P. As shown in FIG. 3C, the DDB 302 in the N-type diffusion region 306N is formed by the dummy gate G(2), $G_D$ similar to the SDB 304. However, the DDB 302 also includes a trench isolation structure 330 formed in an area below the top surface 314 of the substrate 308 of the dummy gate G(2), $G_D$. The trench isolation structure 330 is an isolation material 332, such as a dielectric material, that is formed or filled into a trench 334 formed in the substrate 308 between the dummy gate G(2), $G_D$ in the N-type diffusion region 306N. For example, the trench isolation structure 330 may be considered a shallow trench isolation (STI) structure. Thus, the trench isolation structure 330 and the dummy gate G(2), $G_D$ provide a diffusion break that is considered a double diffusion break and forms the DDB 302.

As will be discussed in more detail below regarding exemplary fabrication processes of the circuit 300, the dummy gate G(2), $G_D$ that forms the DDB 302 and SDB 304 can be formed before or after a removal metal gate (RMG) process formed in the location of the gate G(2) when gates G(1), G(3), and G(4) are formed. For example, the dummy gate G(2), $G_D$ that is included in the DDB 302 and SDB 304 may be formed after the metal gates are formed in gates G(1)-G(4). Gate G(2) in this example can then be removed and the low-k dielectric structure 350 formed to form the dummy gate G(2), $G_D$ for the DDB 302 and the SDB 304 and to reduce parasitic capacitance as described above.

With continuing reference to FIGS. 3A-3C, in this example, the DDB 302 is formed in the N-type diffusion region 306N of the circuit 300, because the DDB 302 induces a tensile strain in the N-type diffusion region 306N during fabrication of the circuit 300. Inducing tensile strain in the N-type diffusion region 306N can increase carrier mobility of the N-type semiconductor channel 310N formed in the N-type diffusion region 306N. Thus, for example, the tensile strain induced in the N-type semiconductor channel 310N formed in the N-type diffusion region 306N used to form the semiconductor channel of the NFET 312N can increase the drive strength of the NFET 312N. For example, the tensile strain induced by the DDB 302 in the N-type semiconductor channel 310N in the N-type diffusion region 306N may increase the N-type device drive current between approximately five percent (5%) and twenty percent (20%). However, inducing tensile strain in the P-type diffusion region 306P that induces such tensile strain in the P-type semiconductor channel 310P formed in the P-type diffusion region 306P may degrade carrier mobility in the P-type semiconductor channel 310P. This would, for example, have the effect of reducing drive strength of the PFET 312P employing the P-type semiconductor channel 310P in the circuit 300. This may not be desired. Thus, in this example, the SDB 304 is formed in the P-type diffusion region 306P of the circuit 300, as opposed to expanding the DDB 302 formed in the N-type diffusion region 306N into the P-type diffusion region 306P. This can avoid inducing and/or reducing tensile stress applied to the P-type diffusion region 306P and the P-type semiconductor channel 310P formed therein so as to lessen or avoid reducing carrier mobility in the P-type semiconductor channel 310P and the PFET 312P.

In this manner, the DDB 302 can be formed in the circuit 300 in FIGS. 3A-3C to purposefully induce tensile strain in the N-type diffusion region 306N and the N-type semiconductor channel 310N formed therein to increase drive strength of NFETs formed in the N-type diffusion region 306N, such as NFET 312N. However, reducing carrier mobility of the P-type semiconductor channel 310P in the P-type diffusion region 306P may be avoided to avoid decreasing the drive strength of PFETs, such as PFET 312P, formed in the P-type diffusion region 306P.

In another exemplary aspect, if the DDB 302 would induce a compressive strain in the N-type diffusion region 306N of the circuit 300, the DDB 302 could be alternatively formed in the P-type diffusion region 306P of the circuit 300, and the SDB 304 formed in the N-type diffusion region 306N of the circuit 300, opposite of the circuit 300 shown in FIGS. 3A-3C. In this example, inducing compressive strain in the P-type diffusion region 306P would increase carrier mobility of the P-type semiconductor channel 310P of the PFET 312P formed in the P-type diffusion region 306P, but reduce carrier mobility in the N-type semiconductor channel 310N of the NFET 312N in the formed in the N-type diffusion region 306N, Thus, in this aspect, the SDB 304 could be formed in the N-type diffusion region 306N to avoid inducing or reducing tensile stress to the N-type diffusion region 306N, so as to not reduce carrier mobility of the NFET 312N that may result from a DDB 302.

Figure 4A:
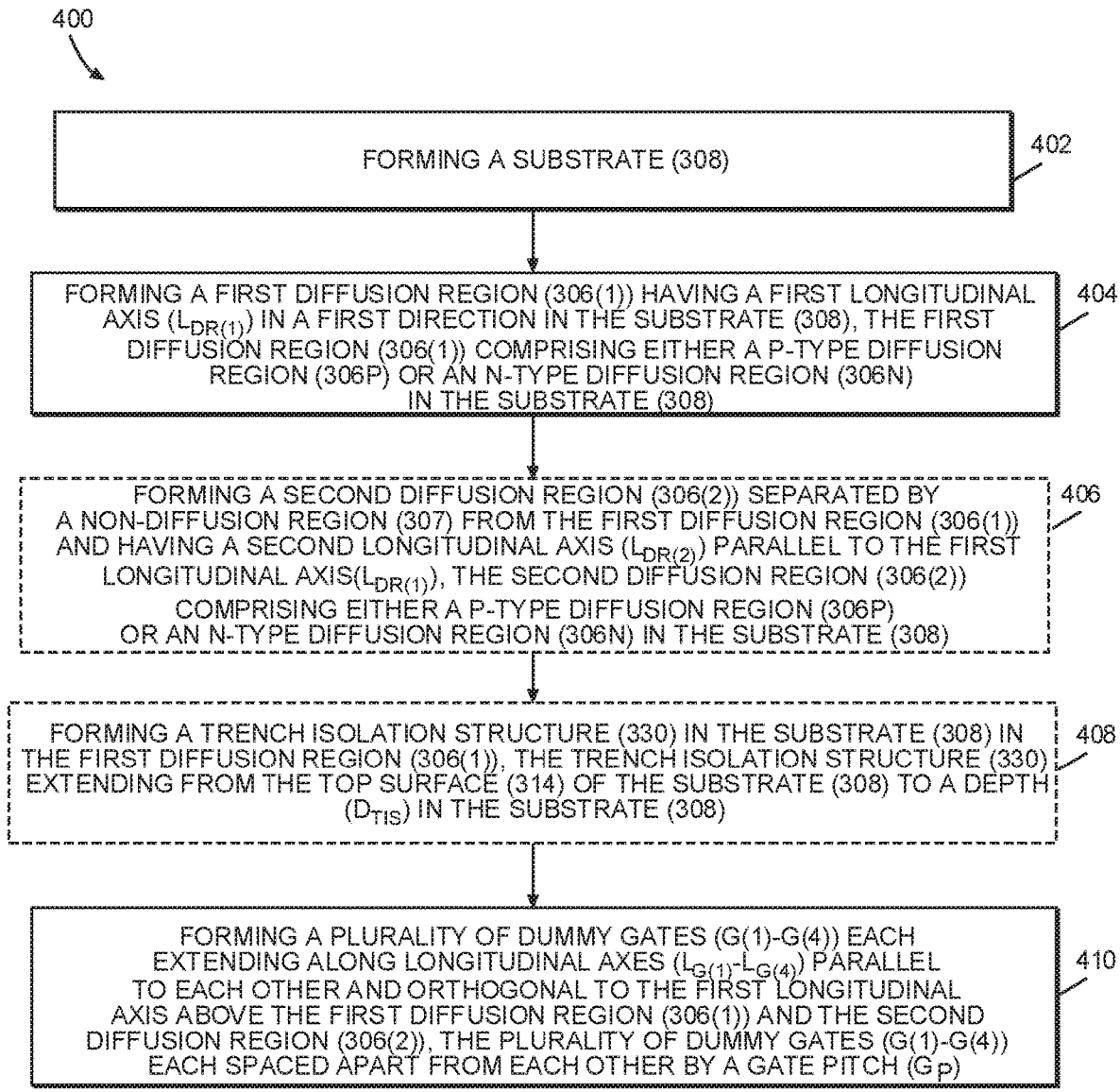
FIGS. 4A and 4B are flowcharts illustrating an exemplary process of fabricating the circuit in FIGS. 3A-3C that includes FETs formed in P-type and N-type diffusion regions and low-k dummy gates adjacent to the FETs to reduce the source/drain parasitic capacitance of the FETs.
Figure 4B:
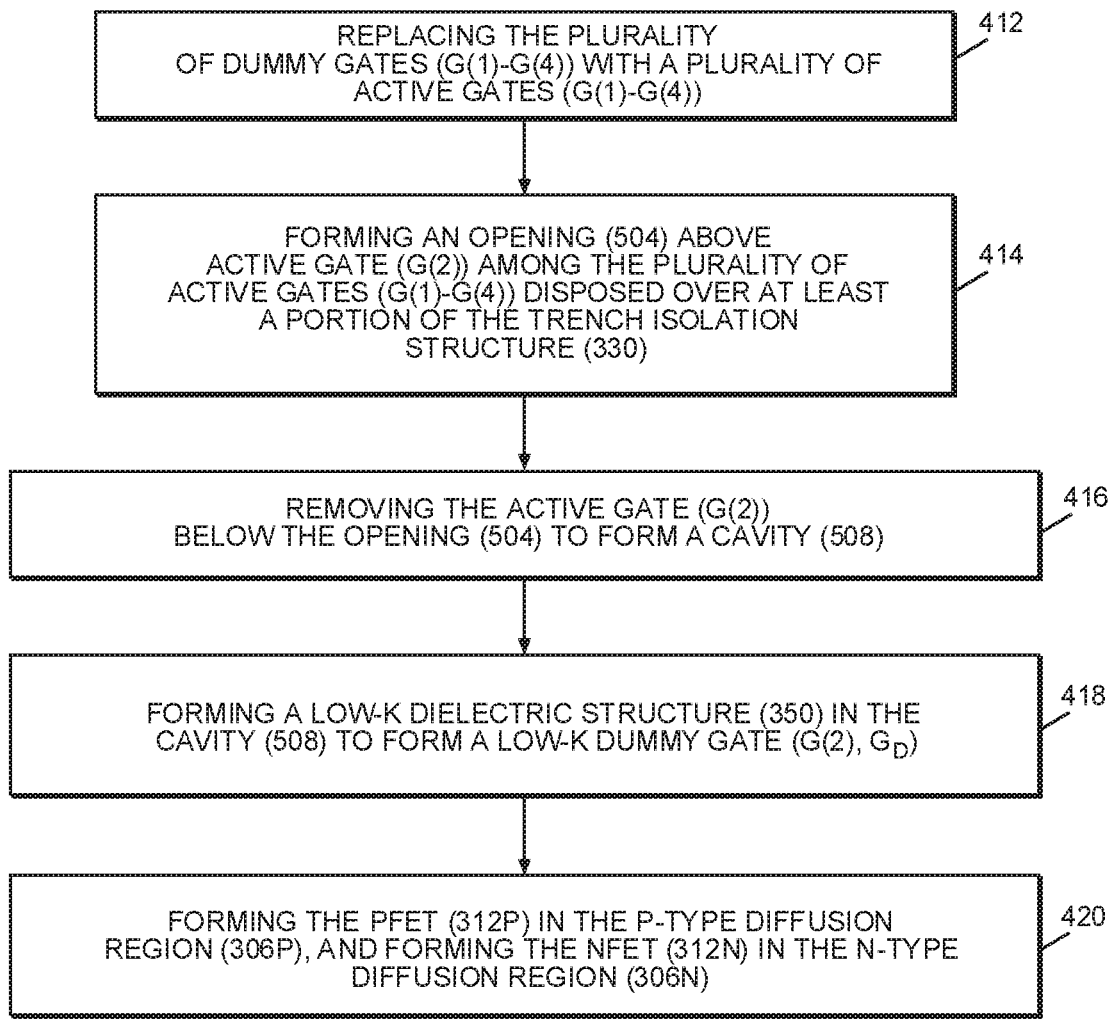

The circuit 300 can be fabricated according to a variety of methods and processes. For example, the circuit 300 can be fabricated according to CMOS fabrication methods. In this regard, FIGS. 4A and 4B are flowcharts illustrating an exemplary process 400 of fabricating circuit 300 in FIGS. 3A-3C. FIGS. 5A-1-5F-3 illustrate exemplary fabrication stages of the circuit 300 as it is fabricated according to the exemplary fabrication process 400. In this regard, the exemplary fabrication process 400 in FIGS. 4A and 4B and the exemplary fabrication stages of the circuit 300 in FIGS. 5A-1-5F-3 will be discussed in conjunction with each other below.

Figure 2:
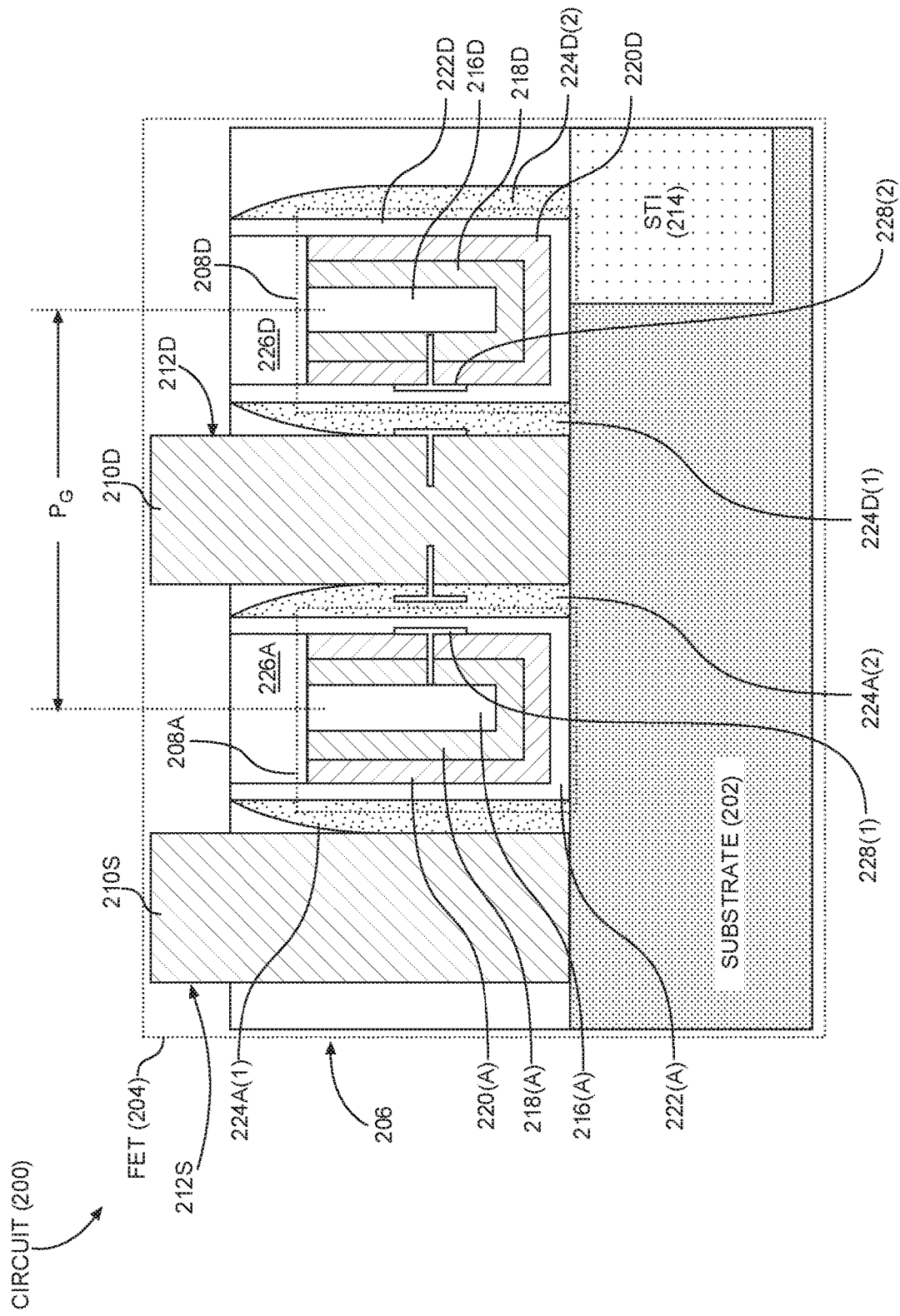
FIG. 2 is a side view of an exemplary circuit that includes a FET formed in a semiconductor substrate and an adjacent dummy gate to illustrate source/drain to gate parasitic capacitances.
Figures 2, 5B:
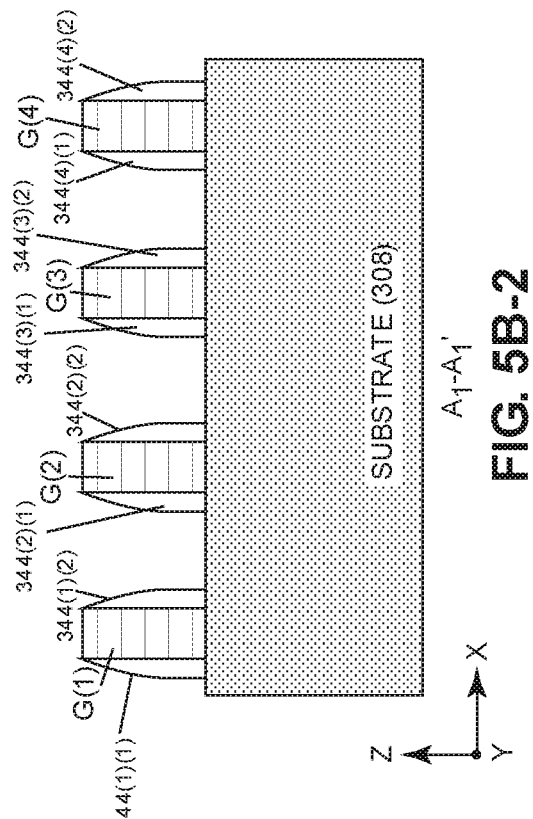
Figures 3, 5B:
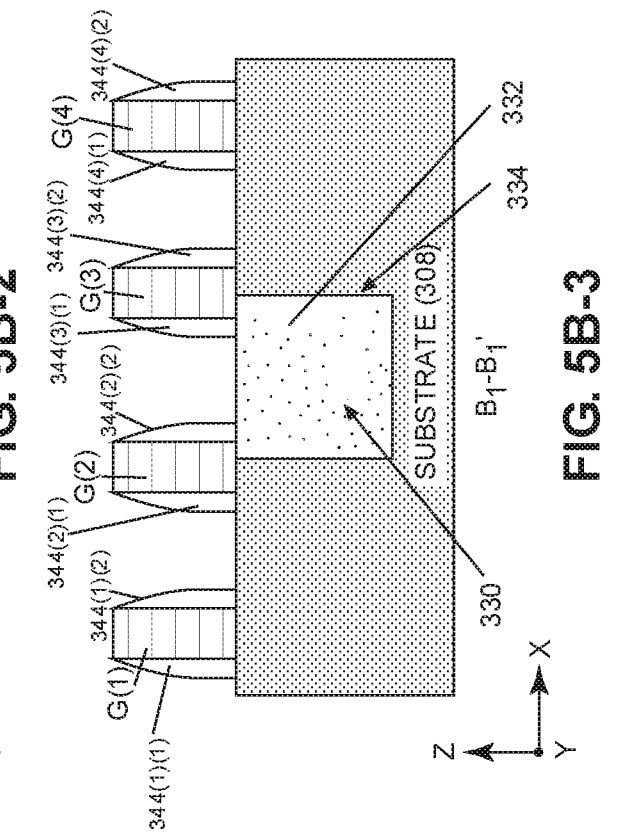
Figures 1, 5B:
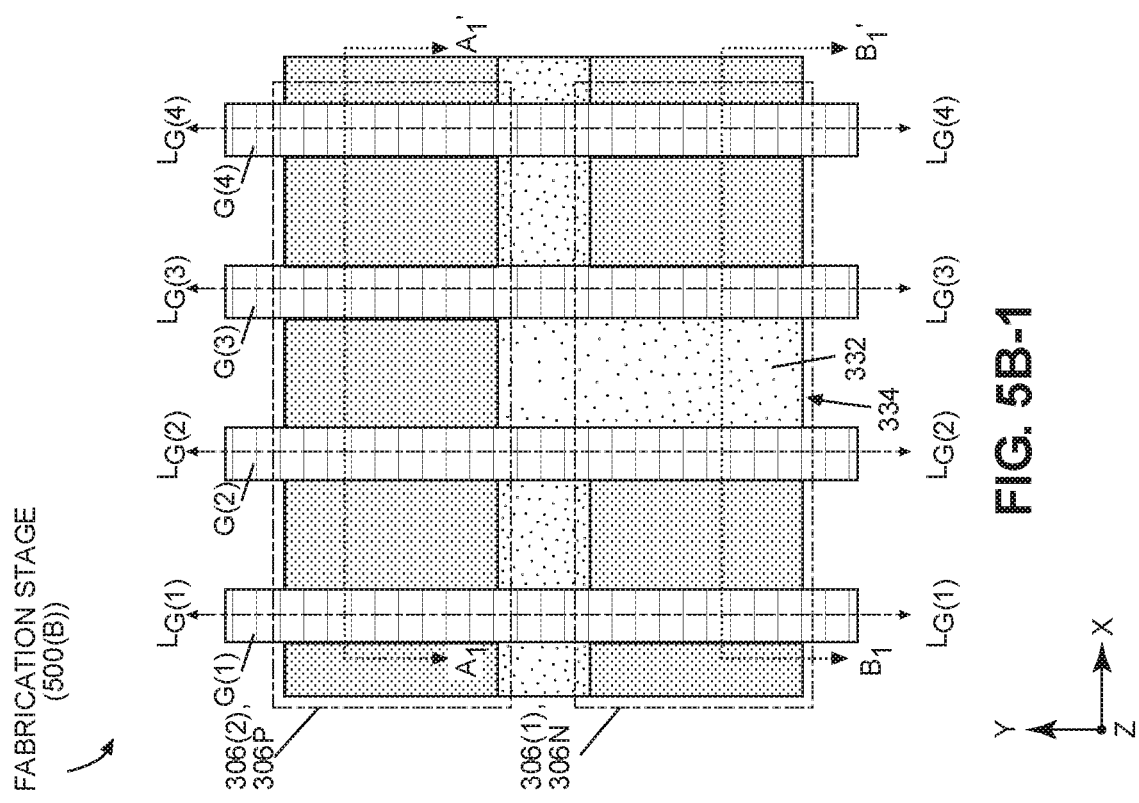

In this regard, with reference to FIG. 4A, a first exemplary step in the process 400 of fabricating the circuit 300 in FIGS. 3A-3C is to form the substrate 308 from a semiconductor material, such as Silicon (Si) for example (block 402 in FIG. 4A). This is shown by example in the fabrication stage 500(A) in FIGS. 5A-1-5A-3. FIG. 5A-1 is a top view of the exemplary fabrication stage 500(A). FIGS. 5A-2 and 5A-3 are cross-sectional views taken in the respective $A_1$-$A_1$ and $B_1$-$B_1$ cross-sections of the substrate 308 in FIG. 5A-1. As shown in FIGS. 5A-1-5A-3, the first diffusion region 306(1) as the N-type diffusion region 306N is formed in the substrate 308 (block 404 in FIG. 4A), In the example of CMOS-based circuit 300 in FIGS. 3A-3C, the second diffusion region 306(2) as the P-type diffusion region 306P is also formed in the substrate 308 (block 406 in FIG. 4A), The N-type and P-type diffusion regions 306N, 306P are separated by the non-diffusion region 307 that is not doped with a P-type or N-type impurity material. The N-type and P-type diffusion regions 306N, 306P have longitudinal axes $L_{DR(N)}$, $L_{DR(P)}$ that are parallel to each other. The trench 334 of depth $D_{TIS}$ formed in the N-type diffusion region 306N and the non-diffusion region 307 as shown in FIGS. 5A-1 and 5A-3 and filled with the isolation material 332 as an option in this example, such as an oxide material, forms a trench isolation structure 330 (block 408 in FIG. 4A) In this example, a portion of the trench isolation structure 330 is formed in the N-type diffusion region 306N and a portion is formed in the non-diffusion region 307. As discussed above, the trench isolation structure 330 formed in the N-type diffusion region 306N will form part of the DDB 302 in the N-type diffusion region 306N.

As an example, the trench 334 to form the trench isolation structure 330 may be etched into the substrate 308 into the pattern that is illustrated in FIG. 5A-1, after transfer, using a lithography process of transferring a photoresist layer above the substrate 308, forming a patterned mask above the photoresist layer, and exposing the substrate 308 through openings in the mask to form openings in the photoresist layer for controlling the areas of the trench 334 to be etched. The trench 334 may then be filled with the isolation material 332 to form the trench isolation structure 330. Note that it is not required for the trench 334 to extend into the non-diffusion region 307, but doing such may be efficient from a processing standpoint so that the non-diffusion region 307 and the trench isolation structure 330 in the N-type diffusion region 306N that will form the DDB 302 can be patterned and formed in the same process.

A next exemplary step in the process 400 of fabricating the circuit 300 in FIGS. 3A-3C can be to form a plurality of dummy gates G(1)-G(4) each extending along respective longitudinal axes $LG_{(1)}$-$LG_{(4)}$ parallel to each other and orthogonal to the longitudinal axes $L_{DR(N)}$-$L_{DR(P)}$ of the N-type diffusion region 306N and the P-type diffusion region 306P (block 410 in FIG. 4A). For example, the dummy gates G(1)-G(4) may be formed as Polysilicon gates. Spacers 344(1)(1)-344(4)(2) are formed around the respective dummy gates G(1)-G(4) to facilitate dummy gate removal (e.g., by lithography and etching process) and replacement with a metal material as a part of an RMG process. The dummy gates G(1)-G(4) can be replaced by active gates in a replacement metal gate process (block 412 in FIG. 4B). This is shown by example in the fabrication stage 500(B) in FIGS. 5B-1-5B-3. FIG. 5B-1 is a top view of the exemplary fabrication stage 500(B). FIGS. 5B-2 and 5B-3 are cross-sectional views taken in the respective $A_1$-$A_1'$ and $B_1$-$B_1'$ cross-sections of the fabrication stage 500(B) in FIG. 5B-1. The description of the active gates G(1), G(3), G(4) and dummy gate G(2) have been previously described for the circuit 300 in FIGS. 3A-3C, and thus are not re-described here.

A next exemplary step in the process 400 of fabricating the circuit 300 in FIGS. 3A-3C can be to deposit the ILD 32.0 above the gates G(1)-G(4) and the N-type and P-type diffusion regions 306N, 306P to provide isolation as previously discussed for the circuit 300 in FIGS. 3A-3C. A top surface 502 of the ILD 320 can be planarized, such as through a chemical mechanical planarization (CMP) process. This is shown by example in the fabrication stage 500(C) in FIGS. 5C-1 and 5C-2. FIGS. 5C-1 and 5C-2 are cross-sectional views taken in the respective $A_1$-$A_1'$ and $B_1$-$B_1'$ cross-sections of the fabrication stage 500(B) in FIG. 5B-1.

A next exemplary step in the process 400 of fabricating the circuit 300 in FIGS. 3A-3C can be to form an opening 504 above an active gate G(2) adjacent to and disposed over the trench isolation structure 330 to prepare the active gate G(2) to be a dummy gate and to form part of the DDB 302 in the N-type diffusion region 306N and the SDB 304 in the P-type diffusion region 306P (block 414 in FIG. 4B). This is shown by example in the fabrication stage 500(D) in FIGS. 5D-1-5D-3. FIG. 5D-1 is a top view of an exemplary fabrication stage 500(D) of forming a mask 506 over a photoresist layer disposed on the HD 320 in the fabrication stage 500(C) in FIG. 5C-1, to expose a diffusion break region in the N-type diffusion and P-type diffusion regions 306N, 306P. FIGS. 5D-2 and 5D-3 are cross-sectional views taken in respective $A_1$-$A_1'$ and $B_1$-$B_1'$ cross-sections of the substrate 308 in FIG. 5D-1.

Figures 2, 5E:
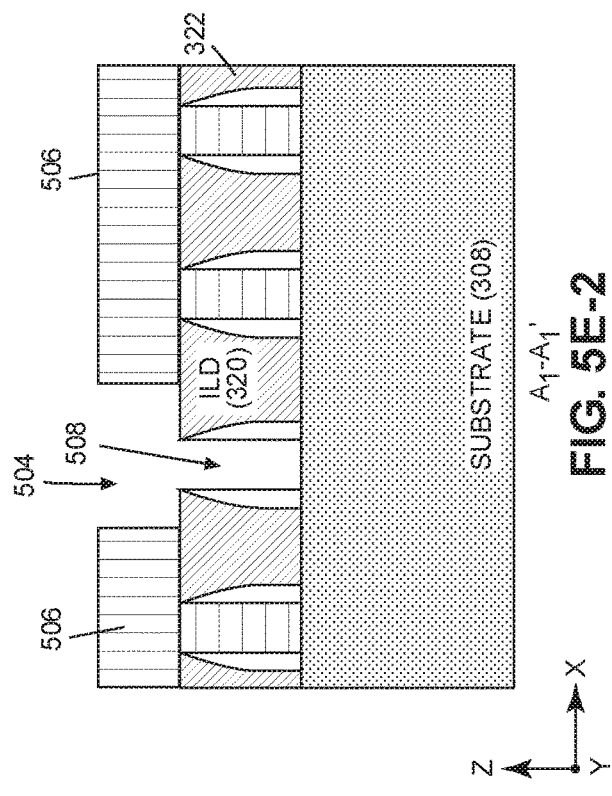
Figures 3, 5E:
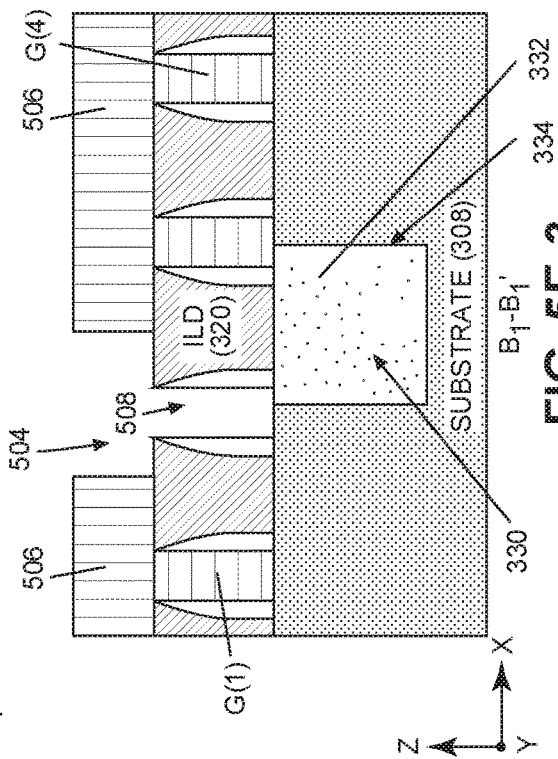
Figures 1, 5E:
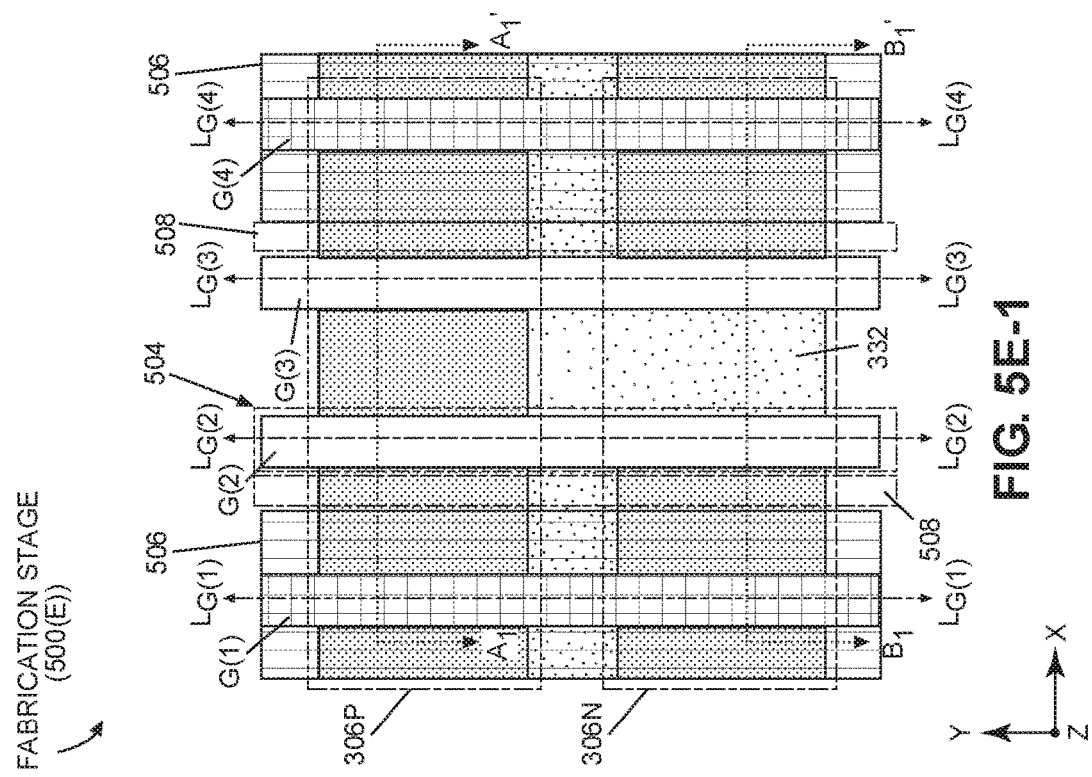

A next exemplary step in the process 400 of fabricating the circuit 300 in FIGS. 3A-3C can be to remove the gate G(2) access through the opening 504 in the fabrication stage 500(D) in FIGS. 5D-1-5D-3 to form a cavity 508 where the material of the gate G(2) was previously formed, This is to prepare for formation of a dummy gate G(2) that is included in the DDB 302 and SDB 304 in the circuit 300 in FIGS. 3A-3C (block 416 in FIG. 4B). This is shown by example in the fabrication stage 500(E) in FIGS. 5E-1-5E-3. FIG. 5E-1 is a top view of the exemplary fabrication stage 500(E) of removing (e.g., etching) the metal material of the gate G(2). FIGS. 5E-2 and 5E-3 are cross-sectional views taken in respective $A_1$-$A_1'$ and $B_1$-$B_1'$ cross-sections of the substrate 308 in FIG. 5E-1. For example, a dry/wet etch process may be used to remove the material formed in the gate G(2) in the fabrication stage 500(D) in FIGS. 5D-1-5D-3.

Figures 1, 5F:
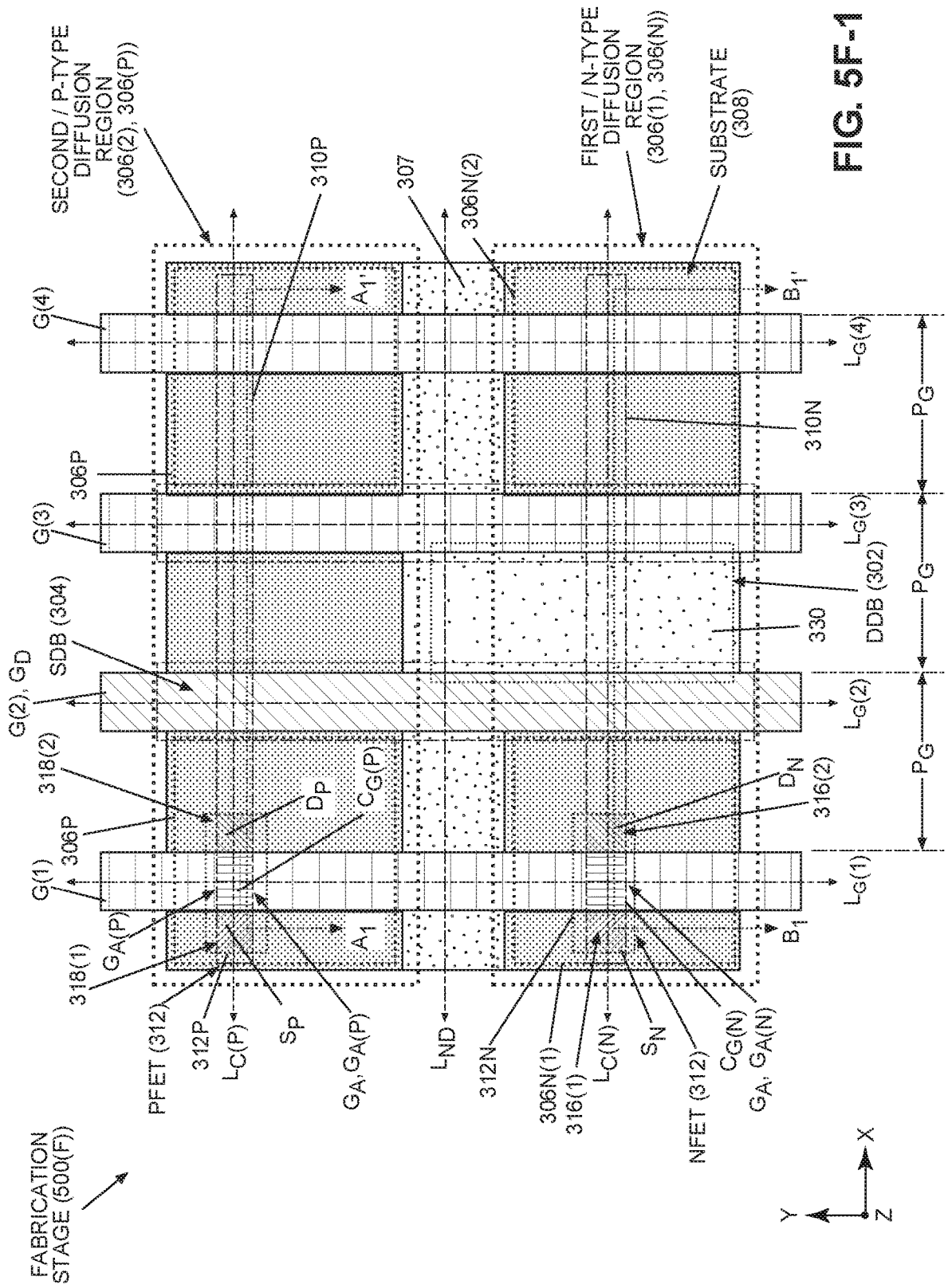

A next exemplary step in the process 400 of fabricating the circuit 300 in FIGS. 3A-3C is to form the low-k dielectric structure 350 in the cavity 508 shown in the fabrication stage 500(D) in FIGS. 5D-1-5D-1 This is shown in the exemplary fabrication stage 500(F) in FIGS. 5F-1-5F-3, the dielectric material 354 filled in the cavity 508 to form the low-k dielectric structure 350 of the dummy gate G(2), $G_D$ (block 418 in FIG. 4B). As previously discussed with regard to the circuit 300 in FIGS. 3A-3C, an air gap 352 can be included in the low-k dielectric structure 350, or the low-k dielectric structure 350 can not include an air gap. Then, as also shown in the fabrication stage 500(F) in FIGS. 5F-1-5F-3, the PFET 312P is formed in the P-type diffusion region 306P, and the NFET 312N is formed in the N-type diffusion region 306N (block 420 in FIG. 4B). The previous discussion of exemplary structures of the PFET 312P and the NFET 312N in FIGS. 3A-3C are applicable for the fabrication stage 500(F) in in FIGS. 5F-1-5F-3.

Figure 6A:
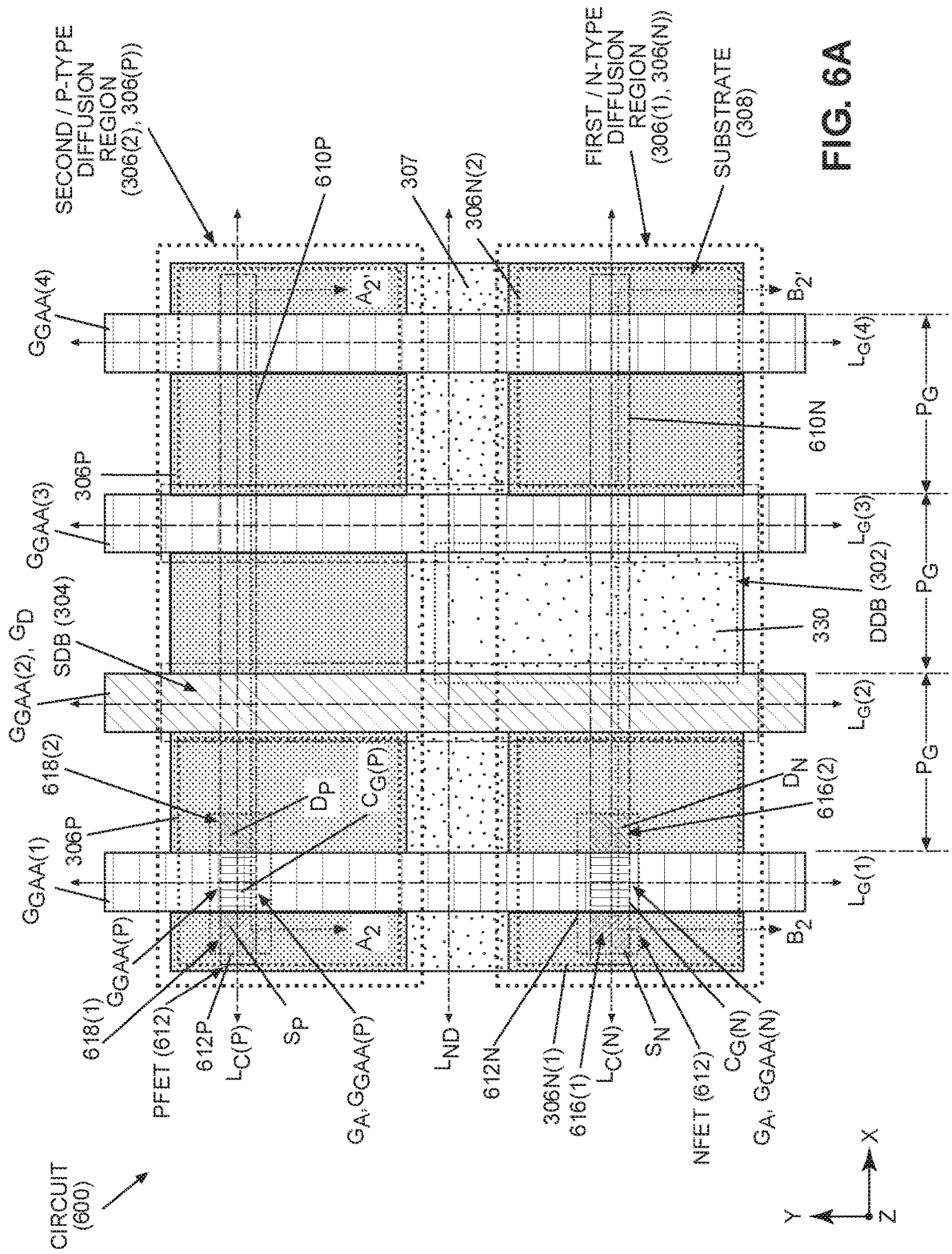
FIG. 6A is a top view of an exemplary integrated circuit ("circuit") that includes FETs in the form of gate-all-around (GAA) FETs formed in P-type and N-type diffusion regions, wherein the circuit further includes low-k dummy gates adjacent to the FETs to reduce the source/drain parasitic capacitance of the FETs.

Other types of FETs other than FinFETs can be formed in the circuit 300 in FIGS. 3A-3C. For example, FIGS. 6A-6C illustrate an exemplary circuit 600 that includes a GAA NFET 612N and a GAA PFET 612P and employs the low-k dummy gate $G_{GAA}(2)$, $G_D$ adjacent to the GAA NFET 612N and/or GAA PFET 612P to reduce the source/drain parasitic capacitance of the GAA NFET 612N and/or GAA PFET 612P. In this regard, FIG. 6A is a top view of the circuit 600. FIGS. 6B and 6C are cross-sectional views taken in respective, cross-sections $A_2$-$A_2'$, $B_2$-$B_2'$ of the circuit 600 in FIG. 6A to further illustrate the low-k dummy gate $G_{GAA}(2)$, $G_D$ adjacent to the GAA NFET 612N and/or GAA PFET 612P. Common elements and components between the circuit 300 in FIGS. 3A-3C and the circuit 600 in FIGS. 6A-6C are illustrated with common element labeling and numbers and thus will not be re-described.

As shown in FIG. 6A, N-type and P-type semiconductor channels 610N, 610P in the form of nano structures (e.g., nanowires, nanoslabs, nanotubes) are formed in the circuit 600 above the substrate 308 and extended along longitudinal axes $L_{C(N)}$, $L_{C(P)}$ in the X-axis direction. Gates $G_{GAA}(1)$-$G_{GAA}(4)$ are formed in the circuit 600 along longitudinal axes $L_{G(1)}$-$L_{G(4)}$ in the Y-axis direction, orthogonal to the longitudinal axes $L_{C(N)}$, $L_{C(P)}$ of the N-type and P-type semiconductor channels 610N, 610P in the X-axis direction, and extend above and around at least a portion of the P-type and N-type semiconductor channels 610N, 610P. Gates $G_{GAA}(1)$ and $G_{GAA}(4)$ are active gates of a conductive material, such as metal (referred to herein as "active gates" G(1) or G(4)). Gates $G_{GAA}(1)$, $G_{GAA}(3)$, and $G_{GAA}(4)$ are conducting gates that can be employed to provide an active gate for forming a FET 612 or as an interconnection for local wiring connections in the circuit 600. In this example, gate G(2) is a dummy gate $G_D$ (referred to herein as "dummy gate" $G_{GAA}(2)$ or $G_D$). As shown in FIG. 6A, a GAA NFET 612N is formed in the N-type diffusion region 306N by forming a source $S_N$ and drain $D_N$ on opposites sides of the active gate $G_{GAA(N)}$ in the N-type diffusion region 306N. Similarly, as shown in FIG. 6A, a GAA PFET 612P is formed in the P-type diffusion region 306P by forming a source $S_P$ and drain $D_P$ on opposites sides of the active gate $G_{GAA(P)}$ in the P-type diffusion region 306P.

With reference to FIGS. 6B and 6C, the N-type and P-type semiconductor channels 610N, 610P are disposed on the top surface 314 of the substrate 308 in this example. The gates $G_{GAA}(1)$-$G_{GAA}(4)$ are located adjacent to each other and have a gate pitch $P_G$ according to the layout of a circuit cell. For example, gate $G_{GAA}(1)$ is located adjacent to dummy gate $G_{GAA}(2)$, $G_D$. Dummy gate $G_{GAA}(2)$, $G_D$ is disposed between and adjacent to conducting gate $G_{GAA}(1)$ and conducting gate $G_{GAA}(3)$. Any of conducting gates $G_{GAA}(1)$, $G_{GAA}(3)$, $G_{GAA}(4)$ can be employed to form active gates for FETs formed in the circuit 600, but in this example as shown in FIGS. 6A-6C, conducting gate $G_{GAA}(1)$ is employed as an active gate that extends around the N-type and P-type semiconductor channels 310N, 310P providing active gates $G_{GAA(P)}$, $G_{GAA(N)}$ for a respective GAA PFET 612P and GAA NFET 612N.

As shown in FIG. 6A, a gate contact $C_{G(N)}$ is formed over a portion of the conducting gate $G_{GAA}(1)$ to form the active gate $G_{GAA(N)}$ for the GAA NFET 612N. Similarly, a gate contact $C_{G(P)}$ is formed over a portion of the conducting gate $G_{GAA}(1)$ to form the active gate $G_{A(P)}$ for the GAA PFET 612P. The source $S_N$ and a drain $D_N$ of the NFET 612N are formed in first and second end portions 616(1), 616(2) in the N-type semiconductor channel 610N on opposite sides of the active gate G(1) where the gate contact $C_{G(N)}$ is formed over the active gate $G_{A(N)}$. The source $S_P$ and a drain $D_P$ of the GAA PFET 612P are formed in first and second end portions 618(1), 618(2) in the P-type semiconductor channel 610P on opposite sides of the conducting gate $G_{GAA}(1)$ where the gate contact $C_{G(P)}$ is formed over the active gate $G_{GAA(P)}$. As shown in FIGS. 6B and 6C, respective metal source contacts $C_{S(P)}$, $C_{S(N)}$ and metal drain contacts $C_{D(P)}$, $C_{D(N)}$ are formed above and in contact with the respective sources $S_P$, $S_N$ and drains $D_P$, $D_N$.

To reduce or mitigate an increase in the source/drain parasitic capacitance(s) of the GAA PFET 612P and/or the GAA NFET 612N in the circuit 600 in FIGS. 6A-6C, the dummy gate $G_D$ adjacent to active gates $G_{GAA(P)}$, $G_{GAA(N)}$ and respective metal drain contacts $C_{D(P)}$, $C_{D(N)}$ of the GAA PFET 612P and/or the GAA NFET 612N in this example is provided to have the low-k dielectric structure 350. In this manner, the relative permittivity (k) between the metal drain contacts $C_{D(P)}$, $C_{D(N)}$ of the PFET 612P and/or the NFET 612N and the adjacent dummy gate $G_D$ is reduced, thereby reducing the parallel plate capacitance of the metal drain contacts $C_{D(P)}$, $C_{D(N)}$ of the GAA PFET 612P and/or the GAA NFET 612N, and thus reducing the parasitic resistance of the GAA PFET 612P and/or the GAA NFET 612N, Also, the dummy gate $G_D$ having the low-k dielectric structure 350 disposed between the metal drain contacts $C_{D(P)}$, $C_{D(N)}$ of the GAA PFET 612P and/or the GAA NFET 612N and adjacent conducting gate $G_{GAA}(3)$ reducing the parallel plate capacitance of the metal drain contacts $C_{D(P)}$, $C_{D(N)}$ to the adjacent conducting gate $G_{GAA}(3)$, thus reduces the parasitic resistance of the GAA PFET 612P and/or the GAA NFET 612N. For example, the low-k dielectric structure 350 may have a permittivity less than or equal to 4.0, and between 3.0 to 3.5 as non-limiting examples.

As previously discussed, the low-k dielectric structure 350 of the dummy gate $G_D$ in this example includes the air gap 352. The air gap may have a permittivity of 1.0. The dielectric material 354 may surround the air gap 352. As another example, the low-k dielectric structure 350 of the dummy gate $G_D$ may not include an air gap, or an air gap that is at least fifteen percent (15%) of a volume of the low-k dielectric structure 350. Instead, the low-k dielectric structure 350 may be formed from the dielectric material 354 that does not include an air gap. For example, the dielectric material 354 may have a permittivity less than or equal to 4.0, and between 3.0 to 3.5 as non-limiting examples whether the low-k dielectric structure 350 includes the air gap 352 or not. The dielectric material 354 may be a material selected from an oxide material, a silicon oxide material, or a carbon-doped silicon oxide material, as non-limiting examples.

The exemplary fabrication processes of the circuit 300 in FIGS. 4A and 4B and FIGS. 5A-1-5F-3 can be employed to form the low-k dummy gate $G_{GAA}(2)$, $G_D$, the GAA NFET 612N, and GAA PFET 612P shown in FIGS. 6A-6C.

Figure 7A:
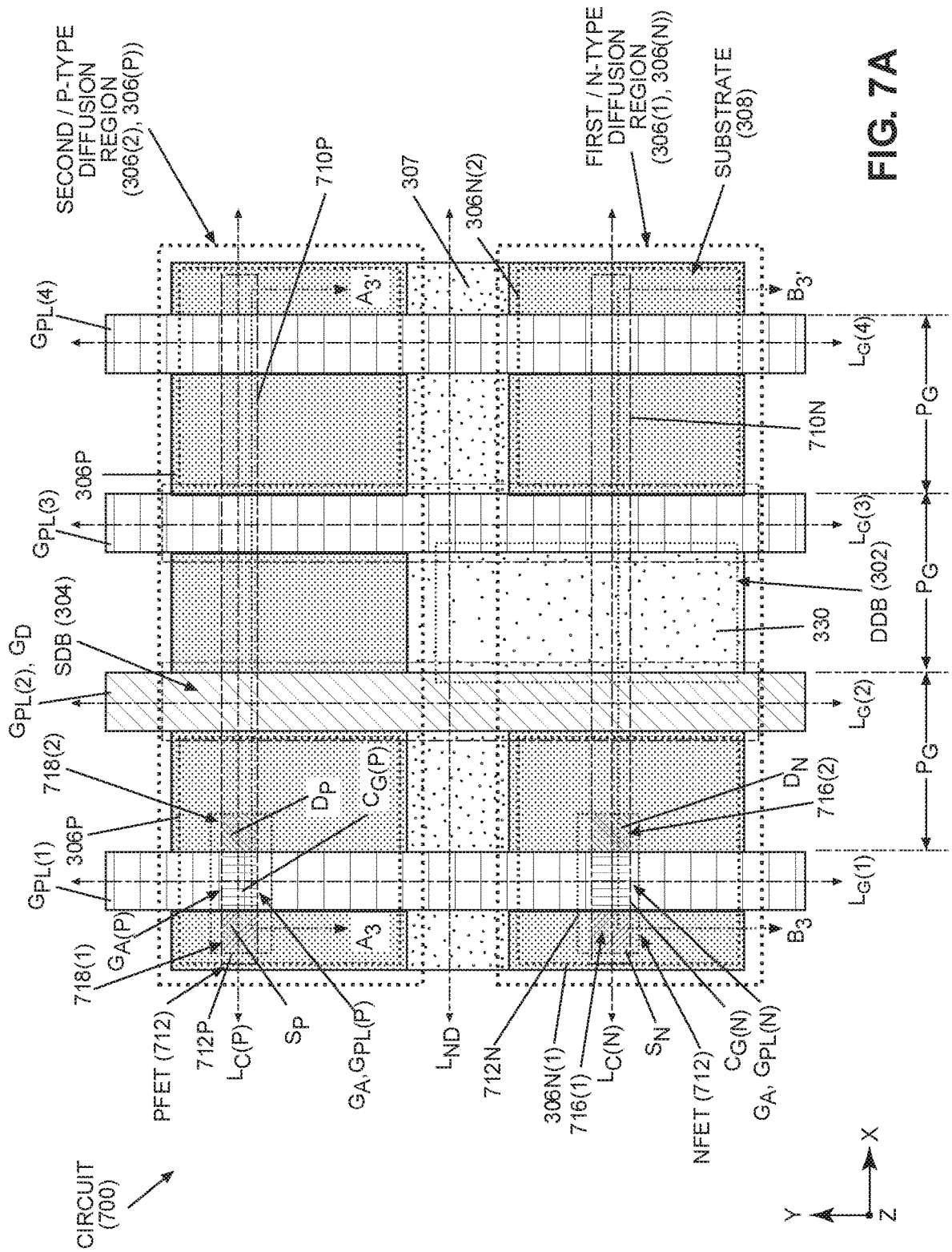
FIG. 7A is a top view of an exemplary integrated circuit ("circuit") that includes FETs in the form of planar FETs formed in P-type and. N-type diffusion regions, wherein the circuit further includes low-k dummy gates adjacent to the FETs to reduce the source/drain parasitic capacitance of the FETs.

FIGS. 7A-7C illustrate another exemplary circuit 700 that includes a planar NFET 712N and a planar PFET 712P and employs a low-k dummy gate $G_{PL}(2)$, $G_D$ adjacent to the planar NFET 712N and/or planar PFET 712P to reduce the source/drain parasitic capacitance of the planar NFET 712N and/or planar PFET 712P. In this regard, FIG. 7A is a top view of the circuit 700. FIGS. 7B and 7C are cross-sectional views taken in respective, cross-sections $A_3$-$A_3'$, $B_3$-$B_3'$ of the circuit 700 in FIG. 7A to further illustrate the low-k dummy gate $G_{PL}(2)$, $G_D$ adjacent to the planar NFET 712N and/or planar PFET 712P. Common elements and components between the circuit 300 in FIGS. 3A-3C and the circuit 700 in FIGS. 7A-7C are illustrated with common element labeling and numbers and thus will not be re-described.

As shown in FIG. 7A, N-type and P-type semiconductor channels 710N, 710P in the form of planar structures are formed in the circuit 700 above the substrate 308 and extended along longitudinal axes $L_{C(N)}$, $L_{C(P)}$ in the X-axis direction. Gates $G_{PL}(1)$-$G_{PL}(4)$ are formed in the circuit 700 along longitudinal axes $L_{G(1)}L_{G(4)}$ in the Y-axis direction, orthogonal to the longitudinal axes $L_{C(N)}$, $L_{C(P)}$ of the N-type and P-type semiconductor channels 710N, 710P in the X-axis direction, and extend above and around at least a portion of the P-type and N-type semiconductor channels 710P, 710N. Gates $G_{PL}(1)$ and $G_{PL}(4)$ are active gates of a conductive material, such as metal (referred to herein as "active gates" G(1) or G(4)). Gates $G_{PL}(1)$ $G_{PL}(3)$, and $G_{PL}(4)$ are conducting gates that can be employed to provide an active gate for forming a planar FET 712 or as an interconnection for local wiring connections in the circuit 700. In this example, gate G(2) is a dummy gate $G_D$ (referred to herein as "dummy gate" $G_{PL}(2)$ or $G_D$). As shown in FIG. 7A, a planar NFET 712N is formed in the N-type diffusion region 306N by forming a source $S_N$ and drain $D_N$ on opposites sides of the active gate $G_{PL(N)}$ in the N-type diffusion region 306N. Similarly, as shown in FIG. 7A, a planar PFET 712P is formed in the P-type diffusion region 306P by forming a source $S_P$ and drain $D_P$ on opposites sides of the active gate $G_{PL(P)}$ in the P-type diffusion region 306P.

With reference to FIGS. 7B and 7C, the N-type and P-type semiconductor channels 710N, 710P are disposed on the top surface 314 of the substrate 308 in this example. The gates $G_{PL}(1)$-$G_{PL}(4)$ are located adjacent to each other and have a gate pitch $P_G$ according to the layout of a circuit cell. For example, gate $G_{PL}(1)$ is located adjacent to dummy gate $G_{PL}(2)$, $G_D$. Dummy gate $G_{PL}(2)$, $G_D$ is disposed between and adjacent to conducting gate $G_{PL}(1)$ and conducting gate $G_{PL}(3)$. Any of conducting gates $G_{PL}(1)$, $G_{PL}(3)$, $G_{PL}(4)$ can be employed to form active gates for FETs formed in the circuit 700, but in this example as shown in FIGS. 7A-7C, conducting gate $G_{PL}(1)$ is employed as an active gate that extends around the N-type and P-type semiconductor channels 310N, 310P providing active gates $G_{PL(P)}$ $G_{PL(N)}$ for a respective planar PFET 712P and planar NFET 712N.

As shown in FIG. 7A, a gate contact $C_{G(N)}$ is formed over a portion of the conducting gate $G_{PL}(1)$ to form the active gate $G_{PL(N)}$ for the planar NFET 712N. Similarly, a gate contact $C_{G(P)}$ is formed over a portion of the conducting gate $G_{PL}(1)$ to form the active gate $G_{A(P)}$ for the planar PFET 712P, The source $S_N$ and a drain $D_N$ of the NFET 712N are formed in first and second end portions 716(1), 716(2) in the N-type semiconductor channel 710N on opposite sides of the active gate G(1) where the gate contact $C_{G(N)}$ is formed over the active gate $G_{A(N)}$. The source $S_P$ and a drain $D_P$ of the planar PFET 712P are formed in first and second end portions 718(1), 718(2) in the P-type semiconductor channel 710P on opposite sides of the conducting gate $G_{PL}(1)$ where the gate contact $C_{G(P)}$ is formed over the active gate $G_{PL(P)}$. As shown in FIGS. 7B and 7C, respective metal source contacts $C_{S(P)}$, $C_{S(N)}$ and metal drain contacts $C_{D(P)}$, $C_{D(N)}$ are formed above and in contact with the respective sources $S_P$, $S_N$ and drains $D_P$, $D_N$.

To reduce or mitigate an increase in the source/drain parasitic capacitance(s) of the planar PFET 712P and/or the planar NFET 712N in the circuit 700 in FIGS. 7A-7C, the dummy gate $G_D$ adjacent to active gates $G_{PL(P)}$, $G_{PL(N)}$ and respective metal drain contacts $C_{D(P)}$, $C_{D(N)}$ of the planar PFET 712P and/or the planar NFET 712N in this example is provided to have the low-k dielectric structure 350. In this manner, the relative permittivity (k) between the metal drain contacts $C_{D(P)}$, $C_{D(N)}$ of the PFET 712P and/or the NFET 712N and the adjacent dummy gate $G_D$ is reduced, thereby reducing the parallel plate capacitance of the metal drain contacts $C_{D(P)}$, $C_{D(N)}$ of the planar PFET 712P and/or the planar NFET 712N, and thus reducing the parasitic resistance of the planar PFET 712P and/or the planar NFET 712N. Also, the dummy gate $G_D$ having the low-dielectric structure 350 disposed between the metal drain contacts $C_{D(P)}$, $C_{D(N)}$ of the planar PFET 712P and/or the planar NFET 712N and adjacent conducting gate $G_{PL}(3)$ reducing the parallel plate capacitance of the metal drain contacts $C_{D(P)}$, $C_{D(N)}$ to the adjacent conducting gate $G_{PL}(3)$, thus reducing the parasitic resistance of the planar PFET 712P and/or the planar NFET 712N. For example, the low-k dielectric structure 350 may have a permittivity less than or equal to 4.0, and between 3.0 to 3.5 as non-limiting examples.

As previously discussed, the low-k dielectric structure 350 of the dummy gate $G_D$ in this example includes the air gap 352. The air gap may have a permittivity of 1.0. The dielectric material 354 may surround the air gap 352. As another example, the low-k dielectric structure 350 of the dummy gate $G_D$ may not include an air gap, or an air gap that is at least fifteen percent (15%) of a volume of the low-k dielectric structure 350. Instead, the low-k dielectric structure 350 may be formed from the dielectric material 354 that does not include an air gap. For example, the dielectric material 354 may have a permittivity less than or equal to 4.0, and between 3.0 to 3.5 as non-limiting examples whether the low-k dielectric structure 350 includes the air gap 352 or not. The dielectric material 354 may be a material selected from an oxide material, a silicon oxide material, or a carbon-doped silicon oxide material, as non-limiting examples.

The exemplary fabrication processes of the circuit 300 in FIGS. 4A and 4B and FIGS. 5A-1-5F-3 can be employed to form the low-k dummy gate $G_{PL}(2)$, $G_D$, the planar NFET 712N and planar PFET 712P shown in FIGS. 7A-7C.

In another exemplary aspect, a circuit is provided. The circuit comprises a substrate. Examples of the substrate include, without limitation, the substrate 308 in the circuit 300 in FIGS. 3A-3C, circuit 600 in FIGS. 6A-6C, and circuit 700 in FIGS. 7A-7C. The circuit also comprises a means for providing a diffusion in the substrate, the means for providing the diffusion comprising at least one means for providing a semiconducting channel. Examples of the means for providing a diffusion in the substrate include, without limitation, the P-type diffusion region 306P and the N-type diffusion region 306N in the circuit 300 in FIGS. 3A-3C, circuit 600 in FIGS. 6A-6C, and circuit 700 in FIGS. 7A-7C. Examples of the at least one means for providing a semiconducting channel include, without limitation, the P-type and N-type semiconducting channels 310P, 310N in the circuit 300 in FIGS. 3A-3C, the P-type and N-type semiconducting channels 610P, 610N in the circuit 600 in FIGS. 6A-6C, and the P-type and N-type semiconducting channels 710P, 710N in the circuit 700 in FIGS. 7A-7C. The circuit also comprises a means for controlling conduction in the at least one means for providing a semiconducting channel. Examples of the means for controlling conduction include, without limitation, the conducting gates G(1), G(3), and G(4) in the circuit 300 in FIGS. 3A-3C, the conducting gates $G_{GAA}(1)$, $G_{GAA}(3)$, and $G_{GAA}(4)$ in the circuit 600 in FIGS. 6A-6C, and the conducting gates $G_{PL}(1)$, $G_{PL}(3)$, and $G_{PL}(4)$ in the circuit 700 in FIGS. 7A-7C. The circuit also comprises a FET in the means for providing the diffusion. The FET comprises a gate comprising an active gate in a portion of the means for controlling conduction, a semiconductor channel among at least one means for providing a semiconducting channel, a source in a first end portion of the semiconductor channel, and a drain in a second end portion of the semiconductor channel. Example of the FET include, without limitation, the HET 312P and NFET 312N in the circuit 300 in FIGS. 3A-3C, the GAA PFET 612P and the GAA NFET 612N in the circuit 600 in FIGS. 6A-6C, and the planar PFET 712P and planar NFET 712N in the circuit 700 in FIGS. 7A-7C. The circuit also comprises a means for providing a low-k isolation adjacent to the active gate of the FET by a gate pitch and disposed adjacent to either the source or the drain of the FET. Examples of the means for providing a low-k isolation adjacent to the active gate of the FET include, without limitation, the dummy gate G(2), $G_D$ and/or the low-k dielectric structure 350 in the circuit 300 in FIGS. 3A-3C, the dummy gate $G_{GAA(2)}$, $G_D$ and/or the low-k dielectric structure 350 in the circuit 600 in FIGS. 6A-6C, and the dummy gate $G_{PL}(2)$, $G_D$ and/or the low-k dielectric structure 350 in the circuit 700 in FIGS. 7A-7C.

Circuits that include a low-k dummy gate adjacent to a FET(s) to reduce the source/drain parasitic capacitance of the FET(s), including but not limited to the circuit 300 in FIGS. 3A-3C, the circuit 600 in FIGS. 6A-6C, and the circuit 700 in FIGS. 7A-7C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
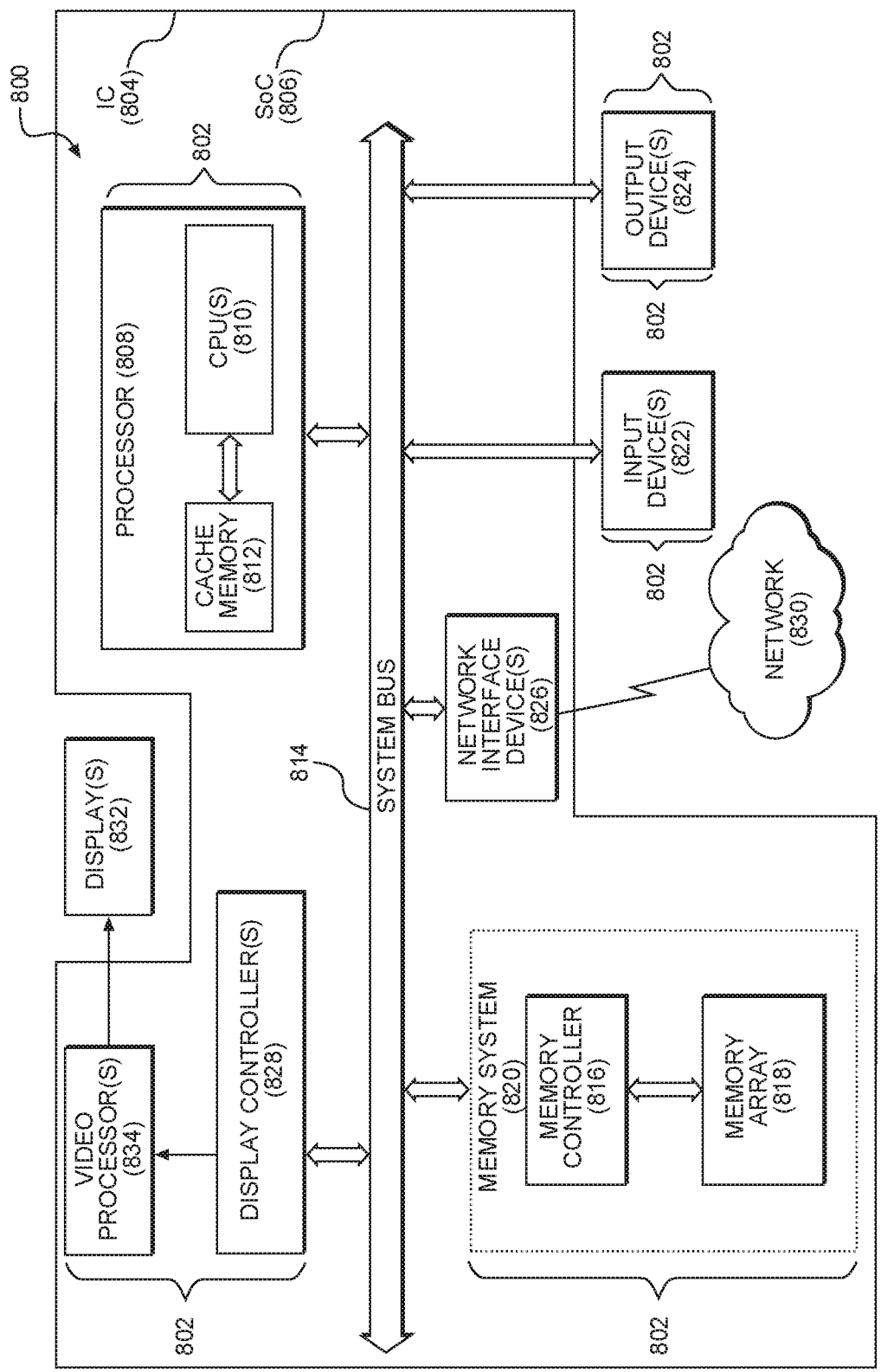
FIG. 8 is a block diagram of an exemplary processor-based system that can include a circuit that includes a FET formed in a diffusion region, wherein the circuit further includes a low-k dummy gate adjacent to the FET to reduce the source/drain parasitic capacitance of the FET, including but not limited to the circuits in FIGS. 3A-3C, 6A-6C, and 7A-7C.

In this regard, FIG. 8 illustrates an example of a processor-based system 800 that can include circuits 802 that include a low-k dummy gate adjacent to a FET(s) to reduce the source/drain parasitic capacitance of the FET(s), including but not limited to the circuit 300 in FIGS. 3A-3C, the circuit 600 in FIGS. 6A-6C, and the circuit 700 in FIGS. 7A-7C, and according to any aspects disclosed herein. In this example, the processor-based system 800 may be formed as an IC 804 in a system-on-a-chip (SoC) 806. The processor-based system 800 includes a processor 808 that includes one or more central processor units (CPUs) 810, which may also be referred to as CPU(s) or processor cores. The processor 808 may have cache memory 812 coupled to the processor(s) 808 for rapid access to temporarily stored data. As an example, the cache memory 812 could include circuits 802 that include a low-k dummy gate adjacent to a FET(s) to reduce the source/drain parasitic capacitance of the FET(s), including but not limited to the circuit 300 in FIGS. 3A-3C, the circuit 600 in FIGS. 6A-6C, and the circuit 700 in FIGS. 7A-7C, and according to any aspects disclosed herein. The processor 808 is coupled to a system bus 814 and can intercouple master and slave devices included in the processor-based system 800. As is well known, the processor 808 communicates with these other devices by exchanging address, control, and data information over the system bus 814. For example, the processor 808 can communicate bus transaction requests to a memory controller 816 as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. Each of the memory system 820, the one or more input devices 822, the one or more output devices 824, the one or more network interface devices 826, and the one or more display controllers 828 can include circuits 802 that include a low-k dummy gate adjacent to a FET(s) to reduce the source/drain parasitic capacitance of the FET(s), including but not limited to the circuit 300 in FIGS. 3A-3C, the circuit 600 in FIGS. 6A-6C, and the circuit 700 in FIGS. 7A-7C, and according to any aspects disclosed herein. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The processor 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display(s) 832 can include any type of display, including, but not limited to, a cathode ray tube (CRT), a liquid crystal display (LCD), a plasma display, a light emitting diode (LED) display, etc. The display controller(s) 828, display(s) 832, and/or the video processor(s) 834 can include circuits 802 that include a low-k dummy gate adjacent to a FET(s) to reduce the source/drain parasitic capacitance of the FET(s), including but not limited to the circuit 300 in FIGS. 3A-3C, the circuit 600 in FIGS. 6A-6C, and the circuit 700 in FIGS. 7A-7C, and according to any aspects disclosed herein.

Figure 9:
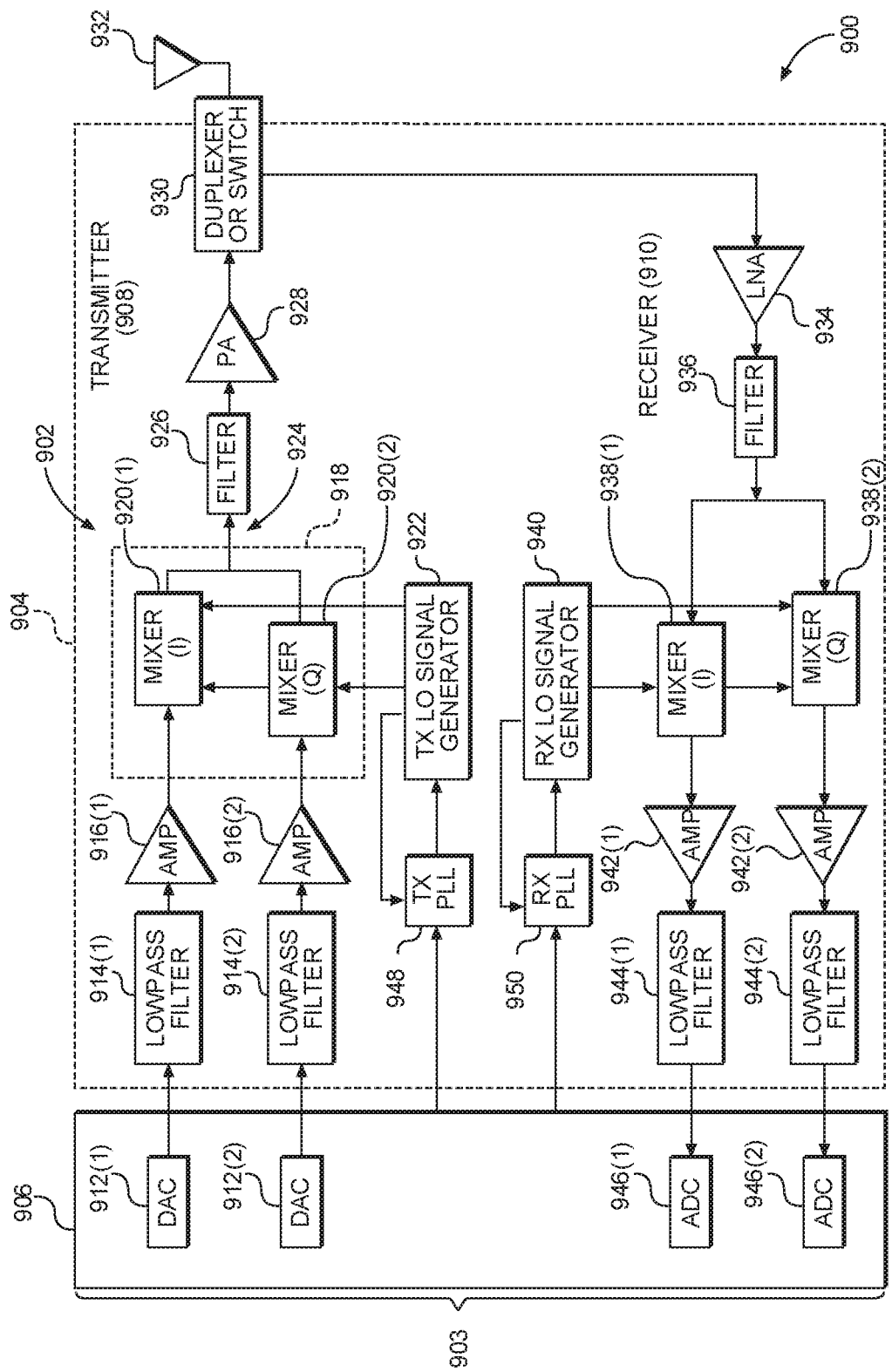
FIG. 9 is a block diagram of an exemplary wireless communications device that includes radio frequency (RF) components formed from an integrated circuit (IC), wherein any of the components therein can include a circuit that includes a FET formed in a diffusion region, wherein the circuit further includes a low-k dummy gate adjacent to the FET to reduce the source/drain parasitic capacitance of the FET, including but not limited to the circuits in FIGS. 3A-3C, 6A-6C, and 7A-7C.

FIG. 9 illustrates an exemplary wireless communications device 900 that includes radio frequency (RF) components formed from an IC 902, wherein any of the components therein can include circuits 903 that include a low-k dummy gate adjacent to a FET(s) to reduce the source/drain parasitic capacitance of the FET(s), including but not limited to the circuit 300 in FIGS. 3A-3C, the circuit 600 in FIGS. 6A-6C, and the circuit 700 in FIGS. 7A-7C, and according to any aspects disclosed herein. The wireless communications device 900 may include or be provided in any of the above referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RE to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMP) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive RX-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by amplifiers (AMP) 942(1), 942(2) and further filtered by lowpass filters 944(1), 944(2) to obtain I and Q analog input signals, which are provided to the data processor 906. In this example, the data processor 906 includes ADCs 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may he any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:
1. A circuit, comprising:
   a substrate;
   a first diffusion region disposed in the substrate, the first diffusion region comprising at least one semiconductor channel and having a first longitudinal axis in a first direction;

a conducting gate disposed above the first diffusion region and extending along a second longitudinal axis orthogonal to the first longitudinal axis;

a Field-Effect Transistor (FET) in the first diffusion region, the FET comprising:
  a gate comprising an active gate in a portion of the conducting gate disposed above the first diffusion region, wherein the active gate comprises a bottom surface;
  a semiconductor channel among the at least one semiconductor channel;
  a source in a first end portion of the semiconductor channel; and
  a drain in a second end portion of the semiconductor channel; and a low-k dummy gate comprising a low-k dielectric structure disposed above the first diffusion region and extending along a third longitudinal axis orthogonal to the first longitudinal axis, a gate pitch from the active gate of the FET, and disposed adjacent to either the source or the drain of the FET, wherein the low-k dummy gate comprises a bottom surface and wherein the bottom surface of the active gate and the bottom surface of the low-k dummy gate are coplanar.

2. The circuit of claim 1, wherein the low-k dielectric structure has a permittivity less than or equal to 4.0.

3. The circuit of claim 1, wherein the low-k dielectric structure comprises an air gap.

4. The circuit of claim 3, wherein the low-k dielectric structure further comprises a dielectric material surrounding the air gap.

5. The circuit of claim 4, wherein the air gap comprises at least fifteen percent (15%) of a volume of the low-k dielectric structure.

6. The circuit of claim 1, wherein the low-k dielectric structure comprises a dielectric material that has a permittivity less than or equal to 4.0.

7. The circuit of claim 6, wherein the dielectric material is a material comprised from the group consisting of an oxide material, a silicon oxide material, and a carbon-doped silicon oxide material.

8. The circuit of claim 6, wherein the low-k dielectric structure does not comprise an air gap.

9. The circuit of claim 6, wherein the low-k dielectric structure does not comprise a void greater than fourteen percent (14%) of a volume of the low-k dielectric structure.

10. The circuit of claim 1, wherein a second conducting gate is disposed above the first diffusion region and extends along a fourth longitudinal axis orthogonal to the first longitudinal axis.

11. The circuit of claim 1, further comprising a first spacer disposed on a first side of the low-k dielectric structure and a second spacer disposed on a second side of the low-k dielectric structure opposite of the first side.

12. The circuit of claim 1, further comprising a gate capping material disposed on a top surface of the low-k dielectric structure.

13. The circuit of claim 1, wherein the low-k dummy gate further comprises a dielectric material layer, wherein the low-k dielectric structure is disposed on the dielectric material layer.

14. The circuit of claim 1, further comprising a source metal contact disposed above and in contact with the source of the FET, and a drain metal contact disposed above and in contact with the drain of the FET.

15. The circuit of claim 1, further comprising:
a second diffusion region disposed in the substrate, the second diffusion region comprising at least one second semiconductor channel and having a fifth longitudinal axis parallel to the first longitudinal axis;
the first diffusion region comprising either an N-type diffusion region or a P-type diffusion region disposed in the substrate, and the second diffusion region comprising either a P-type diffusion region or an N-type diffusion region opposite of a diffusion type in the first diffusion region; and
a second FET comprising:
  a second gate comprising a second active gate in a portion of the conducting gate disposed above the second diffusion region;
  a second semiconductor channel among the at least one second semiconductor channel;
  a second source in a first end portion of the second semiconductor channel; and
  a second drain in a second end portion of the second semiconductor channel;
the low-k dummy gate further disposed above the second diffusion region.

16. The circuit of claim 15, wherein the low-k dummy gate is further disposed the gate pitch from the second active gate of the second FET and adjacent to either the second source or the second drain of the second FET.

17. The circuit of claim 1, wherein the FET comprises a FinFET, wherein:
the semiconductor channel extends above a top surface of the substrate; and
the active gate is disposed around at least a portion of the semiconductor channel.

18. The circuit of claim 1, wherein the FET comprises a gate-all-around (GAA) FET, wherein:
the semiconductor channel extends above a top surface of the substrate; and
the active gate is disposed completely around the semiconductor channel.

19. The circuit of claim 1, wherein the FET comprises a planar FET, wherein:
the semiconductor channel is disposed in the substrate below a top surface of the substrate; and
the active gate is disposed above the top surface of the substrate above the semiconductor channel.

20. The circuit of claim 1 integrated into an integrated circuit (IC).

21. The circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet;

a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *